United States Patent
Carter et al.

(10) Patent No.: US 11,437,221 B2
(45) Date of Patent: Sep. 6, 2022

(54) SPATIAL MONITORING AND CONTROL OF PLASMA PROCESSING ENVIRONMENTS

(71) Applicant: Advanced Energy Industries, Inc., Fort Collins, CO (US)

(72) Inventors: Daniel Carter, Fort Collins, CO (US); Kevin Fairbairn, Los Gatos, CA (US); Denis Shaw, Fort Collins, CO (US); Victor Brouk, Fort Collins, CO (US)

(73) Assignee: Advanced Energy Industries, Inc., Fort Collins, CO (US)

(*) Notice: Subject to any disclaimer, the term of this patent is extended or adjusted under 35 U.S.C. 154(b) by 0 days.

(21) Appl. No.: 17/171,164

(22) Filed: Feb. 9, 2021

(65) Prior Publication Data
US 2021/0241996 A1    Aug. 5, 2021

Related U.S. Application Data

(63) Continuation-in-part of application No. 16/896,709, filed on Jun. 9, 2020, now Pat. No. 11,282,677, which
(Continued)

(51) Int. Cl.
*H01J 37/32* (2006.01)
*H01L 21/67* (2006.01)

(52) U.S. Cl.
CPC .. *H01J 37/32174* (2013.01); *H01J 37/32412* (2013.01); *H01J 37/32477* (2013.01);
(Continued)

(58) Field of Classification Search
CPC ........... H01J 37/32174; H01J 37/32477; H01J 37/32412; H01J 37/32935;
(Continued)

(56) References Cited

U.S. PATENT DOCUMENTS 5,517,084 A    5/1996 Leung
5,767,628 A    6/1998 Keller et al.
(Continued)

FOREIGN PATENT DOCUMENTS

JP    2007311182 A    11/2007
WO    WO 2004/114461 A2    12/2004
(Continued)

OTHER PUBLICATIONS

Fujimoto, Kayoko, "Notice for Reasons of Rejection Regarding Japanese Patent Application No. 2020-081092", dated Apr. 1, 2021, p. 6, Published in: JP.
(Continued)

*Primary Examiner* — Renan Luque
(74) *Attorney, Agent, or Firm* — Neugeboren O'Dowd PC

(57) ABSTRACT

Systems and methods for plasma processing are disclosed. An exemplary system may include a plasma processing chamber comprising a source to produce a plasma in the processing chamber and at least two bias electrodes arranged within the plasma processing chamber to control plasma sheaths proximate to the bias electrodes. A chuck is disposed to support a substrate, and a source generator is coupled to the plasma electrode. At least one bias supply is coupled to the at least two bias electrodes, and a controller is included to control the at least one bias supply to control the plasma sheaths proximate to the bias electrodes.

15 Claims, 16 Drawing Sheets

Related U.S. Application Data is a continuation of application No. 16/194,104, filed on Nov. 16, 2018, now Pat. No. 10,707,055.

(60) Provisional application No. 62/588,224, filed on Nov. 17, 2017.

(52) U.S. Cl.
CPC .. *H01J 37/32559* (2013.01); *H01J 37/32568* (2013.01); *H01J 37/32706* (2013.01); *H01J 37/32935* (2013.01); *H01L 21/67109* (2013.01)

(58) Field of Classification Search
CPC ........... H01J 37/32559; H01J 37/32568; H01J 37/32706; H01J 37/32082; H01J 37/32137; H01L 21/67109
See application file for complete search history.

(56) References Cited

U.S. PATENT DOCUMENTS

| | | | |
|---|---|---|---|
| 5,907,221 | A | 5/1999 | Sato et al. |
| 6,162,709 | A | 12/2000 | Raoux et al. |
| 6,180,019 | B1 | 1/2001 | Kazumi et al. |
| 6,273,022 | B1 | 8/2001 | Pu et al. |
| 6,288,493 | B1 | 9/2001 | Lee et al. |
| 6,463,875 | B1 | 10/2002 | Chen et al. |
| 6,507,155 | B1 | 1/2003 | Barnes et al. |
| 6,568,346 | B2 | 5/2003 | Pu et al. |
| 6,583,572 | B2 | 6/2003 | Veltrop et al. |
| 6,617,794 | B2 | 9/2003 | Barnes et al. |
| 6,646,385 | B2 | 11/2003 | Howald et al. |
| 6,685,798 | B1 | 2/2004 | Holland et al. |
| 6,694,915 | B1 | 2/2004 | Holland et al. |
| 6,756,737 | B2 | 6/2004 | Doi et al. |
| 6,893,533 | B2 | 5/2005 | Holland et al. |
| 6,924,455 | B1 | 8/2005 | Chen et al. |
| 7,019,253 | B2 | 3/2006 | Johnson |
| 7,096,819 | B2 | 8/2006 | Chen et al. |
| 8,319,436 | B2 | 11/2012 | Carter et al. |
| 8,742,669 | B2 | 6/2014 | Carter et al. |
| 10,811,228 | B2 | 10/2020 | van Zyl et al. |
| 2002/0115301 | A1 | 8/2002 | Savas |
| 2002/0185228 | A1 | 12/2002 | Chen et al. |
| 2004/0007326 | A1 | 1/2004 | Roche et al. |
| 2004/0149218 | A1 | 8/2004 | Collins et al. |
| 2005/0260354 | A1 | 11/2005 | Singh et al. |
| 2009/0200494 | A1 | 8/2009 | Hatem et al. |
| 2009/0298287 | A1 | 12/2009 | Shannon et al. |
| 2013/0320853 | A1 | 12/2013 | Carter et al. |
| 2014/0061156 | A1* | 3/2014 | Brouk ............... H01J 37/32146 216/61 |
| 2014/0062495 | A1 | 3/2014 | Carter et al. |
| 2019/0157043 | A1 | 3/2014 | Shaw et al. |
| 2015/0076112 | A1 | 3/2015 | Sriraman et al. |
| 2015/0315698 | A1 | 11/2015 | Chistyakov |
| 2016/0027616 | A1* | 1/2016 | Ramaswamy ....... H01J 37/3211 315/111.51 |
| 2016/0056017 | A1 | 2/2016 | Kim et al. |
| 2016/0126068 | A1 | 5/2016 | Lee et al. |
| 2016/0126069 | A1 | 5/2016 | Kwon et al. |
| 2016/0240353 | A1 | 8/2016 | Nagami |
| 2017/0099723 | A1 | 4/2017 | Nagami et al. |

FOREIGN PATENT DOCUMENTS

| | | | |
|---|---|---|---|
| WO | WO 2012/007483 | A1 | 1/2012 |
| WO | 2014035889 | A1 | 3/2014 |
| WO | WO2014035897 | A1 | 3/2014 |

OTHER PUBLICATIONS

Kudeka, Stephan, "Communication Pursuant to Article 94(3) EPC Regarding Application No. 10 770 205.2", dated Jun. 8, 2021, p. 6, Published in: EU.

Brayton, John Joseph, "Office Action Regarding U.S. Appl. No. 15/495,513", dated Apr. 14, 2021, p. 10, Published in: US.

Luque, Renan, "Office Action Regarding U.S. Appl. No. 16/896,709", dated May 25, 2021, p. 36, Published in: US.

Hammond, Crystal, "Office Action Regarding U.S. Appl. No. 17/031,027", dated Apr. 28, 2021, p. 9, Published in: US.

EPO, "Extended European Search Report Regarding Patent Application No. 18877737.9", dated Aug. 25, 2021, p. 165, Published in: EP.

EPO, "Extended Search Report Regarding European Patent Appliication No. 18877322", dated Sep. 14, 2021, p. 129, Published in: EP.

EPO, "Extended European Search Report Regarding Patent Application No. 18878531.5", dated Sep. 1, 2021, p. 126, Published in: EP.

Harry Kim, "International Search Report and Written Opinion Regarding International Application No. PCT/US2020/027927", dated Sep. 17, 2021, p. 14, Published in: US.

Adam Palmer, International Search Authority, Australian Patent Office, dated Mar. 25, 2022.

TIPO; Official Letter from the Taiwan Intellectual Property Office (TIPO); dated Feb. 23, 2022.

\* cited by examiner

SPATIAL MONITORING AND CONTROL OF PLASMA PROCESSING ENVIRONMENTS

CLAIM OF PRIORITY UNDER 35 U.S.C. § 120

The present Application for Patent is a Continuation-in-Part of U.S. patent application Ser. No. 16/896,709 entitled "SPATIAL MONITORING AND CONTROL OF PLASMA PROCESSING ENVIRONMENTS" filed Jun. 9, 2020, which is a continuation of patent application Ser. No. 16/194,104 entitled "SPATIAL AND TEMPORAL CONTROL OF ION BIAS VOLTAGE FOR PLASMA PROCESSING" filed Nov. 16, 2018 and issued as U.S. Pat. No. 10,707,055 on Jul. 7, 2020, which claims priority to Provisional Application No. 62/588,224 entitled "SPATIAL AND TEMPORAL CONTROL OF ION BIAS VOLTAGE FOR PLASMA PROCESSING" filed Nov. 17, 2017, all of which are assigned to the assignee hereof and hereby expressly incorporated by reference herein.

BACKGROUND

Field

The present disclosure relates generally to plasma processing. In particular, but not by way of limitation, the present disclosure relates to systems, methods and apparatuses for modifying a plasma process environment with power supplies.

Background

A challenge for plasma processing chambers is controlling the uniformity of the plasma sheath above the substrate, particularly around the edge of the substrate. Discontinuities caused by the substrate edge, the edge of the buried electrical plane, the isolating ring and other chamber related artifacts can impact the sheath uniformity, which changes the trajectory of ions relative to the substrate, and as a consequence, processing of the substrate may be adversely affected.

Prior attempts have used physical changes in the substrate holder, chamber shape, and other physical geometries to try to alleviate these challenges. But these approaches are static, inflexible, and otherwise deficient.

SUMMARY

An aspect may be characterized as a method for plasma processing comprising sustaining a plasma in a plasma processing chamber by inductively coupling a primary inductor to n secondary inductors so current that passes through each of the n secondary inductors results from mutual inductance through the plasma with the primary inductor. The method also includes applying an asymmetric periodic voltage waveform to the plasma processing chamber with a bias supply, and adjusting at least one of current though one or more of the n secondary inductors or one or more characteristics of the asymmetric periodic voltage waveforms to alter a spatial distribution of the plasma.

Another aspect may be characterized as a non-transitory computer-readable medium comprising instructions stored thereon, for at least one of execution by a processor or for configuring a field programmable gate array, to perform plasma processing, the instructions comprising instructions to maintain a plasma in a plasma processing chamber by controlling current in n secondary inductors, wherein n is greater than or equal to one and the current in the n secondary inductors results from mutual inductance through the plasma with the primary inductor. The instructions also include instructions to apply an asymmetric periodic voltage waveform to the plasma processing chamber with a bias supply and adjust at least one of: current though one or more of the n secondary inductors or one or more characteristics of the asymmetric periodic voltage waveform to alter a spatial distribution of the plasma.

Yet another aspect may be characterized as a system for controlling a plasma in a processing chamber comprising a source generator, a primary inductor coupled to the source generator to excite the plasma when power is actively applied by the source generator to the primary inductor, and n secondary inductors positioned relative to the primary inductor so that current that passes through the n secondary inductors results from mutual inductance through the plasma with the primary inductor, wherein n is greater than or equal to one. The system also comprises a terminating element coupled to each of the n secondary inductors to form n terminating elements, wherein the terminating element affects the current through a corresponding secondary inductor to affect the spatial distribution of the plasma. The system also comprises at least one electrical plane arranged within the plasma processing chamber to control a plasma sheath proximate to the at least one electrical plane and at least one bias supply coupled to the at least one electrical plane. At least one controller is coupled to the at least one bias supply to apply an asymmetric periodic voltage waveform to the at least one electrical plane to control the plasma sheath proximate to the electrical plane.

DETAILED DESCRIPTION

Figure 1:
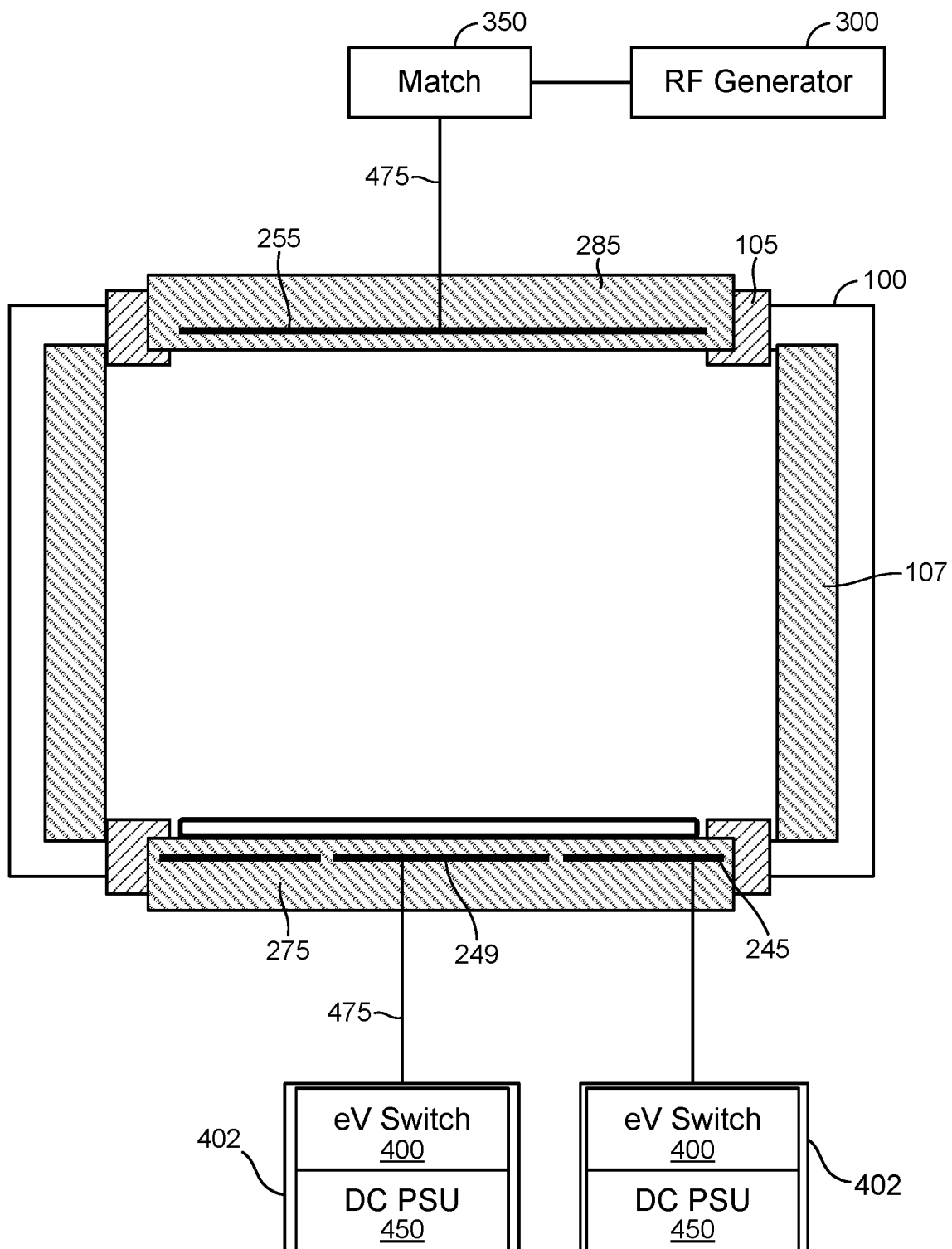
FIG. 1 is a diagram depicting a plasma processing system with a plurality of bias zones.

This disclosure generally describes systems, methods, and apparatus to control the uniformity and intensity of capacitively (or inductively) coupled plasmas both spatially and temporally.

The word "exemplary" is used herein to mean "serving as an example, instance, or illustration." Any embodiment described herein as "exemplary" is not necessarily to be construed as preferred or advantageous over other embodiments. And any reference in this specification to any prior publication (or information derived from it), or to any matter which is known, is not an acknowledgment or admission or any form of suggestion that the prior publication (or information derived from it) or known matter is conventional, routine, or forms part of the common general knowledge in the field of endeavor to which this specification relates.

As a preliminary note, the flowcharts and block diagrams in the following Figures illustrate the architecture, functionality, and operation of possible implementations of systems, methods and computer program products according to various embodiments of the present disclosure. In this regard, some blocks in these flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

While use cases in the following disclosure include wafer plasma processing, implementations can include any substrate processing within a plasma chamber. In some instances, objects other than a substrate can be processed using the systems, methods, and apparatus herein disclosed. In other words, this disclosure applies to plasma processing of any object within a sub-atmospheric plasma processing chamber to effect a surface change, subsurface change, deposition or removal by physical or chemical means.

This disclosure may, but need not, utilize plasma processing and substrate biasing techniques as disclosed in U.S. Pat. Nos. 9,287,092, 9,287,086, 9,435,029, 9,309,594, 9,767,988, 9,362,089, 9,105,447, 9,685,297, 9,210,790. The entirety of these patents are incorporated herein by reference.

For the purposes of this disclosure, "excitation sources," "source generators," "RF sources," or "RF power supplies" are those whose energy is primarily directed to generating and sustaining the plasma, while "bias supplies" are those whose energy is primarily directed to generating a surface potential for attracting ions and electrons from the plasma. Although the frequencies of the source generators and bias supplies vary depending upon a variety of factors (e.g., application-specific factors), in many embodiments, the source generator operates at frequencies of 13.56 MHz and greater and the bias supplies operate at frequencies less than 2 MHz (e.g., without limitation, between 2 MHz and 400 kHz). In other embodiments the frequency of the source supply is less than 13.56 MHz, and it is contemplated that the bias supply may operate at frequencies that exceed 2 MHz. In many applications, the frequency of the source supply is greater than the frequency of the bias supply.

Each of FIGS. 1-4 depicts an exemplary plasma processing system that includes a generic cylindrical symmetric plasma processing chamber 100 with top electrode 285 (e.g., cathode) and lower (substrate) electrode 275 (e.g., anode) of similar area. This simplification of the geometry of the plasma processing chamber 100 eases explanation but should not be a limitation on the various implementations of this disclosure. For instance, the plasma processing chamber 100 may have other than a cylindrical shape (e.g., the processing chamber 100 may have a rectangular shape) and may not be symmetric. In other embodiments, the top and lower electrodes 285, 275 may not have the same shape and/or size.

FIGS. 1-4 also show the electrodes 275, 285 as an insulator with electrical planes 245, 249, 255 buried within. However, in other embodiments, the electrodes 275, 285 may comprise a conductive material or a metal with an insulating coating. More generally, the electrodes 275, 285 can be implemented as any structure that is able to capacitively couple energy into the plasma (top electrode 285) or capacitively generate a bias voltage on the substrate 200 surface (lower electrode 275). Although FIGS. 1-4 depict RF power from a source generator being capacitively coupled to plasma within the plasma chamber 100, it should be recognized that RF energy may also (or alternatively) be inductively coupled from the source generator 300 to the plasma processing chamber 100. Thus, the energy coupling component may be an inductive element (e.g., a coil) instead of the electrical plane 255. In some embodiments, instead of utilizing a source generator (e.g., a source generator), or in addition to using a source generator, plasma is provided to the plasma chamber by a remote plasma source.

The substrate 200 can be any object or item and in some instances, surfaces, that are processed by a plasma to effect surface change, subsurface change, deposition or removal by physical or chemical means.

FIG. 1 illustrates a plasma processing chamber 100 with a top electrode 285 powered by a source generator 300 (also referred to as an "RF source") connected through a match 350 to an energy coupling component (e.g., the buried electrical plane 255) by cable 475 or other conductor. The top electrode 285 is isolated from a body of the plasma processing chamber 100 by an isolating ring 105. The inner walls of a vacuum wall are isolated from the plasma potential in this example by an isolating cylinder 107. The RF excitation from the top electrode 285 is used to generate and maintain the plasma and to control the plasma density. A substrate 200 is shown sitting on a lower electrode 275. This electrode 275 is isolated from the plasma chamber by an isolating ring 110. The present embodiment includes two bias supplies 402, which may each include a DC power supply unit (PSU) 450 and an eV switch 400.

A challenge for plasma processing chambers is controlling the uniformity of the plasma sheath above the substrate 200, particularly around the edge of the substrate. Discontinuities caused by the substrate edge, the edge of the buried electrical plane the isolating ring 110 and other chamber related artifacts can impact the sheath uniformity, and therefore, the processing uniformity of the substrate. Prior attempts used physical changes in the substrate holder, chamber shape, and other physical geometries to try to alleviate these challenges. In addition, many prior approaches operate with a symmetrical (e.g., sinusoidal) output (e.g., where a first half-cycle of the waveform has a corresponding symmetrical component in a last half-cycle of the waveform). But applying a sinusoidal waveform to a substrate induces a broad distribution of ion energies, which limits the ability of the plasma process to carry out a desired etch profile. This disclosure addresses these non-uniformities and deficiencies with a more dynamic and flexible approach.

In general, FIG. 1 depicts multiple bias supplies 402, and each bias supply 402 is coupled to a corresponding electrical plane to form multiple zones (also referred to herein as bias zones) within the plasma processing chamber 100. Although FIG. 1 depicts two zones, it should be recognized that embodiments may include many more than two zones. As shown in FIG. 1, one of the bias supplies 402 is coupled to a central electrical plane 249 and another bias supply 402 is connected to an outer buried electrical plane 245. Each of the bias supplies 402 can be controlled independently of the other bias supply. Using two buried planes 245, 249 and two bias supplies 402 allows non-uniform biasing across the electrode 275. For instance, a higher bias may be applied to the outer buried plane 245 than to the center buried plane 249, or vice versa. Alternatively, different pulsing regimes can be applied to each buried plane 245, 249. While non-uniform biasing can be applied, the result may be a uniform surface potential on the substrate 200. In other words, this multi-buried-plane method can be used to mitigate non-uniformities in the plasma, substrate, etc., and thereby achieve a uniform plasma sheath above the substrate.

The duty cycle of the two bias supplies may also be varied (while running the bias supplies 402 at the same voltages) to compensate for differing rates of processing rate due to non-uniformity effects in the plasma system. Or the bias supplies 402 may be run at different voltages or a combination of both different duty cycles and different voltages (between the bias supplies) to effect the desired processing uniformity. Additional sub divisions of buried electrical planes and corresponding bias supplies may also be utilized (e.g., two or more buried planes and corresponding bias supplies 402 can be implemented). While separate bias supplies 402 are shown, in practice, these could be integrated into one unit with a common DC voltage source but different outputs (e.g., a single DC power supply unit feeding two or more eV switches). Furthermore the output of the eV source could be split with a potential divider between the different buried electrical planes.

Figure 2:
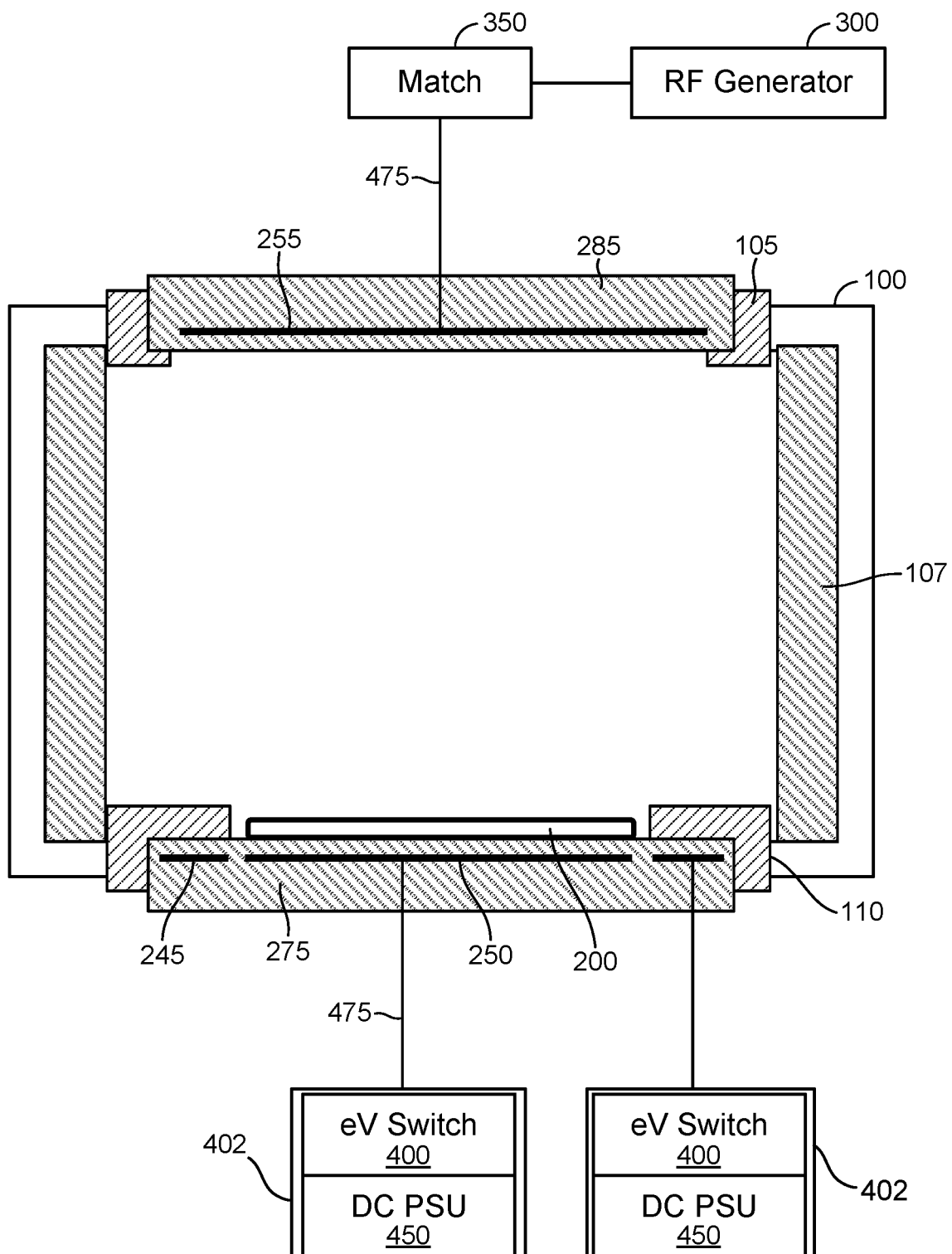
FIG. 2 depicts another plasma processing system with a plurality of bias zones.

FIG. 2 illustrates a further variation of the embodiment shown in FIG. 1. In this instance, rather than being arranged below an outer edge of the substrate 200, the outer buried electrode 245 is arranged at least partially beneath the isolator ring 110. This enables control of the bias and plasma sheath uniformity above the isolator ring 110. In some cases, the bias supply 402 imposed-bias can be controlled to either eliminate the RF plasma induced bias above the isolator ring 110 and avoid processing of the isolator ring 110 as a consumable of the process, or the opposite, to enhance plasma processing of the isolator ring 110.

Figure 3:
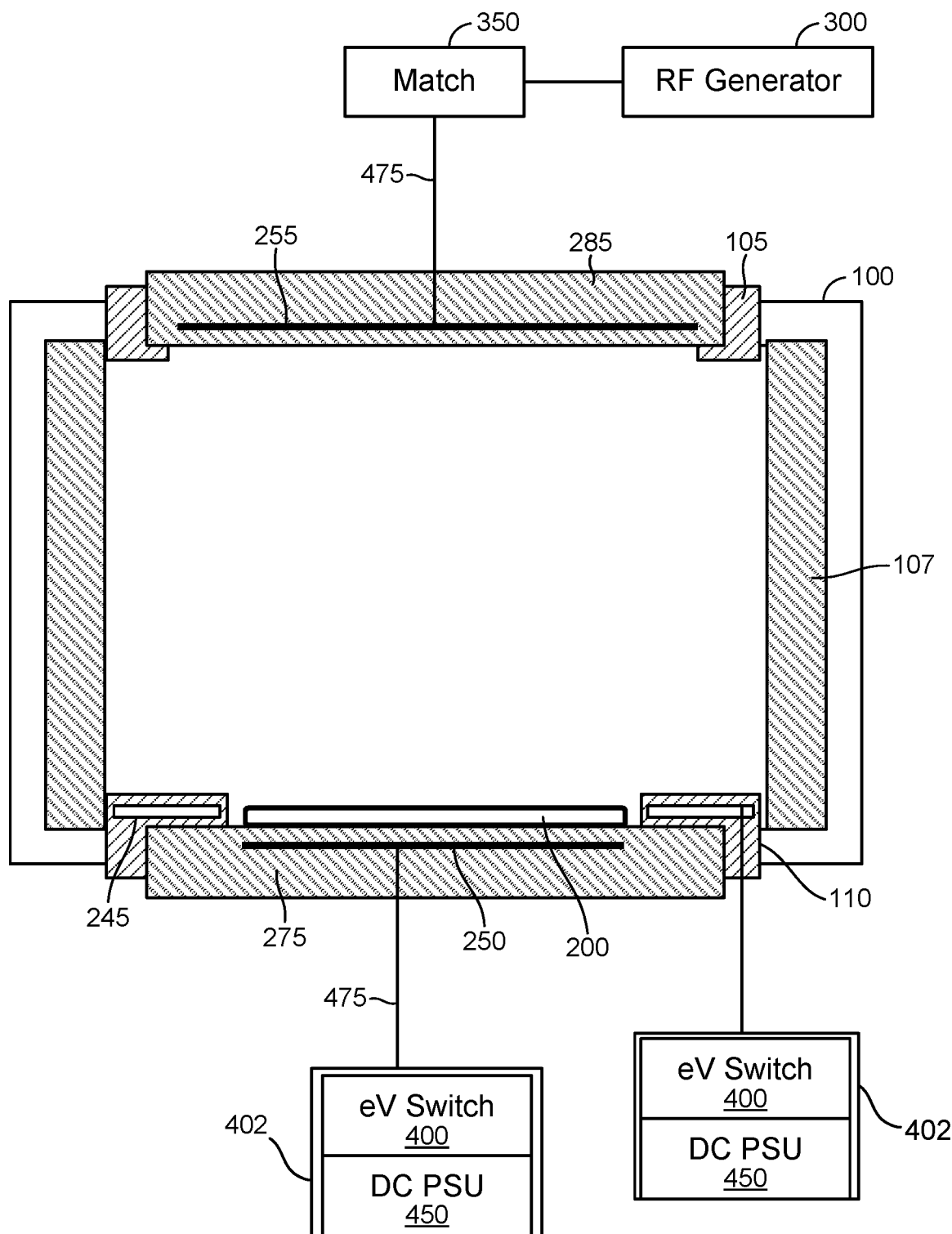
FIG. 3 depicts yet another plasma processing system with a plurality of bias zones.

FIG. 3 illustrates yet a further variation of the embodiment shown in FIG. 2. In this instance, the outer buried electrode 245 is inside the isolator ring 110, to control the bias and sheath uniformity above the isolator ring 110. In some cases, the bias-supply-imposed-bias can be controlled to either eliminate the RF-plasma-induced-bias and avoid processing of the isolator ring 110 as a consumable of the process, or the opposite, to enhance plasma processing of the isolator ring 110.

Figure 4:
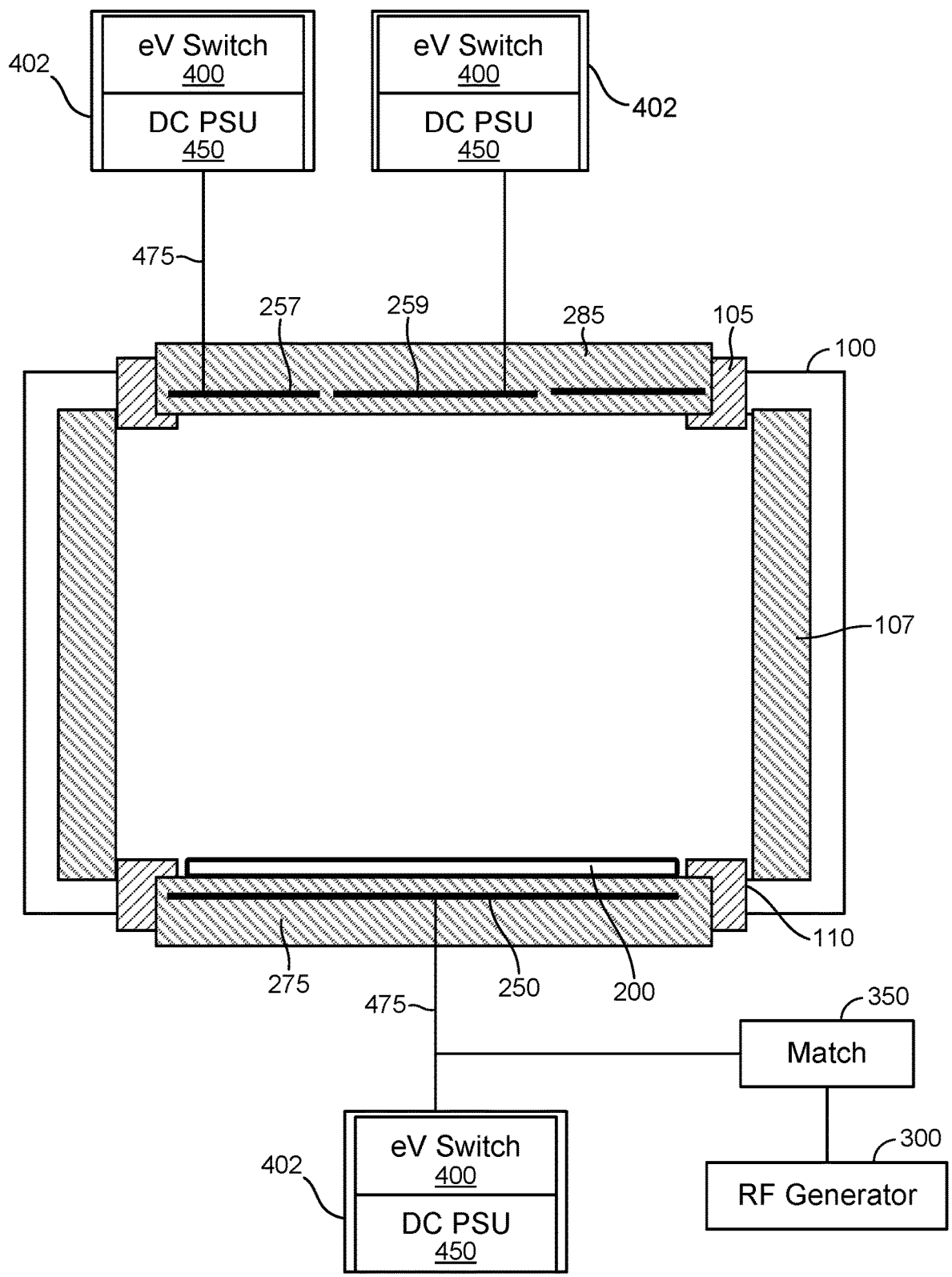
FIG. 4 depicts another plasma processing system with a plurality of bias zones.

FIG. 4 illustrates an embodiment where one or more bias supplies 402 are coupled to one or more top electrodes and one or more RF sources are coupled to the bottom electrode (through a match network 350) along with another one or more bias supplies 402. The filters that may be required to isolate the bias supply 402 and the source generator 300 are not shown, but can be implemented by those of skill in the art. By varying the duty cycles and/or voltage levels of the eV sources, the plasma uniformity can be altered and impact the processing uniformity of the substrate. The material of the top electrode 285 may be used in the processing of the substrate, hence by controlling the bias level(s) of the bias supplies 402, in amplitude, time, uniformity, or a combination of these, the uniformity and rate of substrate 200 processing may be controlled. There may be a desire to suppress the RF induced ion bias voltage above the surface of the top electrode 285, in which case the bias supplies 402 coupled to the electrical planes 257, 259 in the top electrode 285 can be used to cancel this bias voltage. If the RF induced voltage is nonuniform, then multiple bias supplies 402 (e.g., two or more bias supplies 402) can be used to counter these non-uniformities.

In another embodiment, one or more of the bias supplies 402 can be pulsed and/or have its voltage modulated, synchronously with pulsing and/or voltage changes of the source generator 300. For instance, during periods when one or more of the bias supplies 402 lowers a bias voltage from a first to a second bias voltage, the source generator 300 may pulse its output, lower its voltage, or both pulse and lower its voltage output.

These concepts should not be limited to the illustrated numbers of bias supplies 402 and source generators 300. Rather, many sources (e.g., many bias supplies 402 and many source generators 300) can be used, for instance, where complex, region-specific, control of plasma density (e.g., to achieve plasma density uniformity) is desired. It should also be understood that the number of sources need not match the number of electrodes. For instance, four source generators 300 can drive three electrodes, or two source generators can drive five electrodes, to give two non-limiting examples. Further, each source may have a corresponding match network, or a single match network may be coupled to and impedance match two or more sources. Where two or more electrodes are coupled to one or more bias supplies 402, these electrodes can be symmetric (e.g., concentric rings) or asymmetric (e.g., to account for asymmetries in the substrate and/or chamber).

Furthermore, where two or more bias 402 supplies are implemented, each bias supply can be used to determine a localized ion current (and hence ion energy and ion density) and localized sheath capacitance.

Ion current, $I_I$ may be given as:

$$I_I = C_1 \frac{dVo}{dt} \quad \text{(Equation 1)}$$

Where C1 represents the inherent capacitance of components associated with the chamber, which may include insulation, the substrate, substrate support, and an echuck.

Sheath capacitance, $C_{sheath}$, may be given as:

$$C_{sheath} = \frac{C_1 \cdot (I_I + I_C)}{I_C - C_1 \cdot \frac{dV_0}{dt}} \quad \text{(Equation 2)}$$

Multiple bias supplies 402 and their corresponding ability to measure ion current, and hence, ion density at different locations within the chamber can be utilized as feedback for the bias supplies 402 and/or the source generators 300. And sheath capacitance may be calculated and utilized as a parameter value to control sheath capacitance and affect the plasma sheath. Alternatively, or in addition, this feedback can be used to control any electrical and/or mechanical feature of the processing chamber 100 or sources 300, 402. Alternatively, or in addition, this feedback can be used to control any one or more of the following: magnets of the plasma processing chamber 100 (e.g., magnets used to confine or shape the plasma, or magnets used to direct ions generated via a microwave plasma source); pressure control (e.g., pressure valves); mass flow control; gas flow control; gas chemistry control; and physical geometry of the chamber or components therein (e.g., vertical movement of the grounded silicon cap or lid). It will further be appreciated that in depth descriptions of the various known RF sources (e.g., capacitive, inductive, microwave, etc.) is not appropriate here because these are well-known in the art. However, the feedback and synchronization herein described is applicable to any known RF source.

Figure 5:
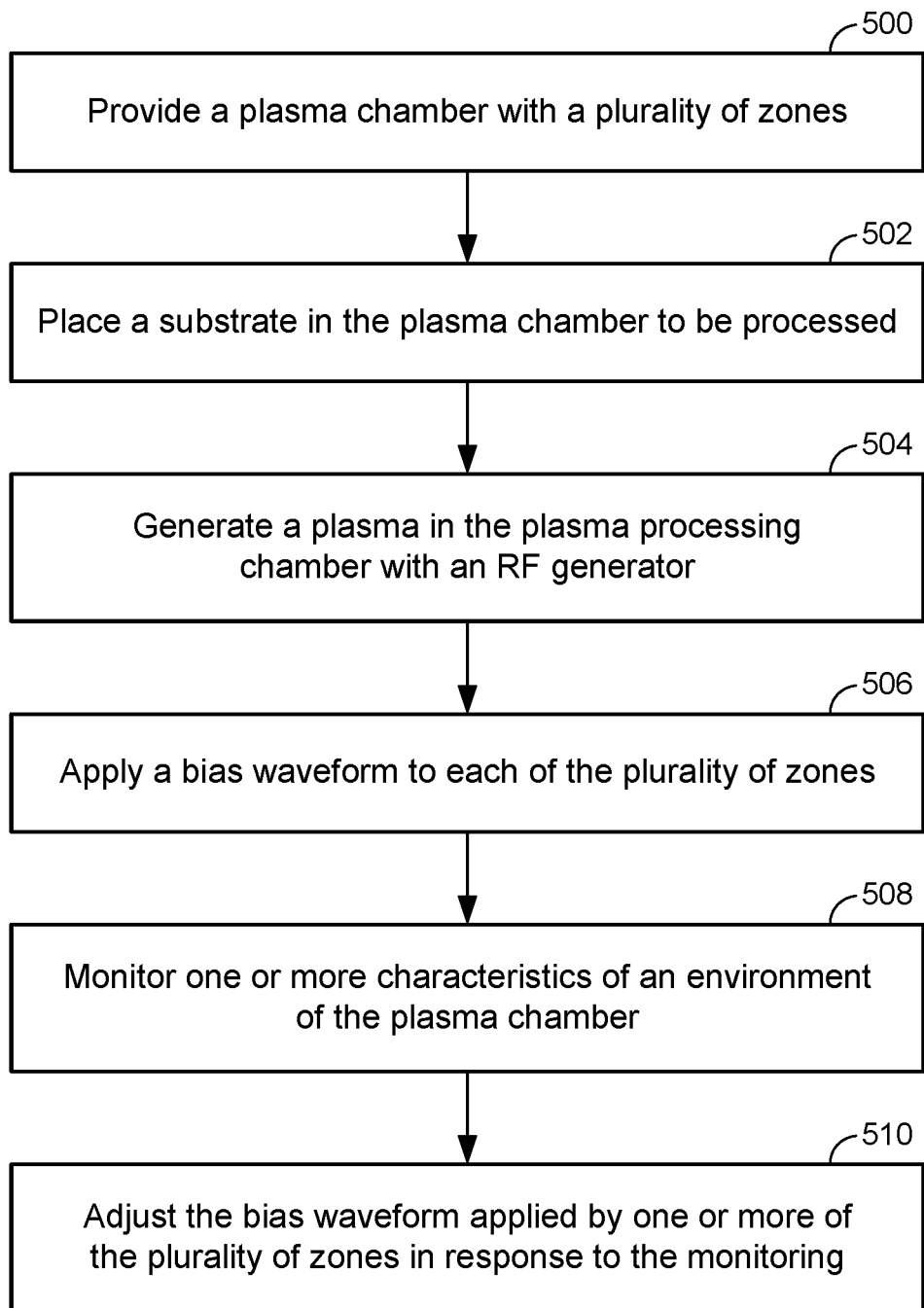
FIG. 5 is a flowchart depicting a method that may be traversed in connection with embodiments disclosed herein.

Referring next to FIG. 5, shown is a flowchart that depicts a method that may be traversed in connection with the several embodiments disclosed herein. The method includes providing a plasma processing chamber with a plurality of zones (Block 500). As described with reference to FIGS. 1-4, each of the zones may be realized in connection with a corresponding electrical plane. For example, each of the electrical planes 245, 249, 250, 257, 259 may establish a corresponding zone (when imparted with a periodic voltage waveform from a bias supply 402) to affect a portion of a sheath of the plasma established in the plasma processing chamber 100. In addition, the substrate 200 is placed in the plasma processing chamber 100 (Block 502) and a plasma is generated in the plasma processing chamber 100 with a source generator (Block 504). As shown, a bias waveform (e.g., an asymmetric periodic voltage waveform) is applied to each of the plurality of zones (Block 506), and one or more characteristics of an environment of the plasma processing chamber 100 are monitored (Block 508). The monitoring of the one or more characteristics may be implemented by sensors or probes within the plasma processing chamber, and/or by monitoring (outside of the plasma processing chamber) one or more aspects of the power applied by the bias supplies 402 or source generators 300. In response to the monitoring (Block 508), the bias waveform (e.g., asymmetric periodic voltage waveform) applied by one or more of the plurality of zones is adjusted (Block 510).

Figure 6:
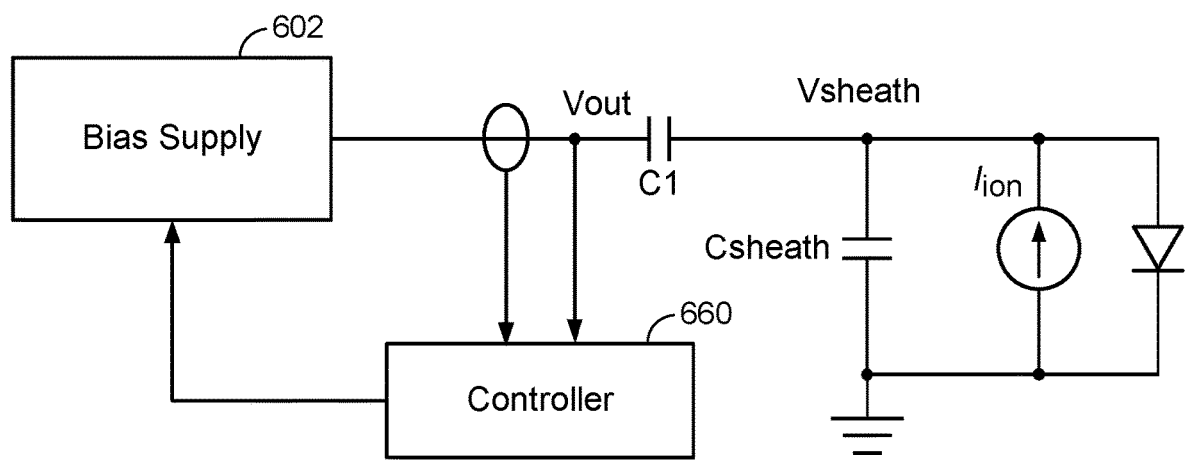
FIG. 6 is a diagram depicting aspects of an exemplary control system.

Referring to FIG. 6, shown are aspects of an exemplary control system that may be used in connection with embodiments herein. Also shown are representations of a sheath capacitance ($C_{sheath}$) and a capacitance C1 that represents the inherent capacitance of components associated with the plasma processing chamber 100, which may include insulation, the substrate, substrate support, and an echuck.

As shown, current and/or voltage may be measured by the controller 660 to indirectly monitor one or more characteristics of an environment of the plasma processing chamber 100 (Block 508). An exemplary characteristic of the environment of the plasma processing chamber 100 may be sheath capacitance ($C_{sheath}$), which may be calculated with Equation 2 using a measured output voltage, Vout.

The monitoring (Block 508) may be performed in advance of processing the substrate to obtain data (e.g., about sheath capacitance and/or other characteristics of the environment of the plasma processing chamber) that is stored, and then the data is utilized to adjust the bias waveform(s)(Block 510)(e.g., in a feed-forward manner). The monitoring at Block 508 may also be performed during plasma processing, and the adjustment at Block 510 (e.g., by adjusting voltage and/or duty cycle of the bias supply 602) may be made using real-time feedback using, for example, voltage and/or current measurements as shown in FIG. 6.

Figure 7:
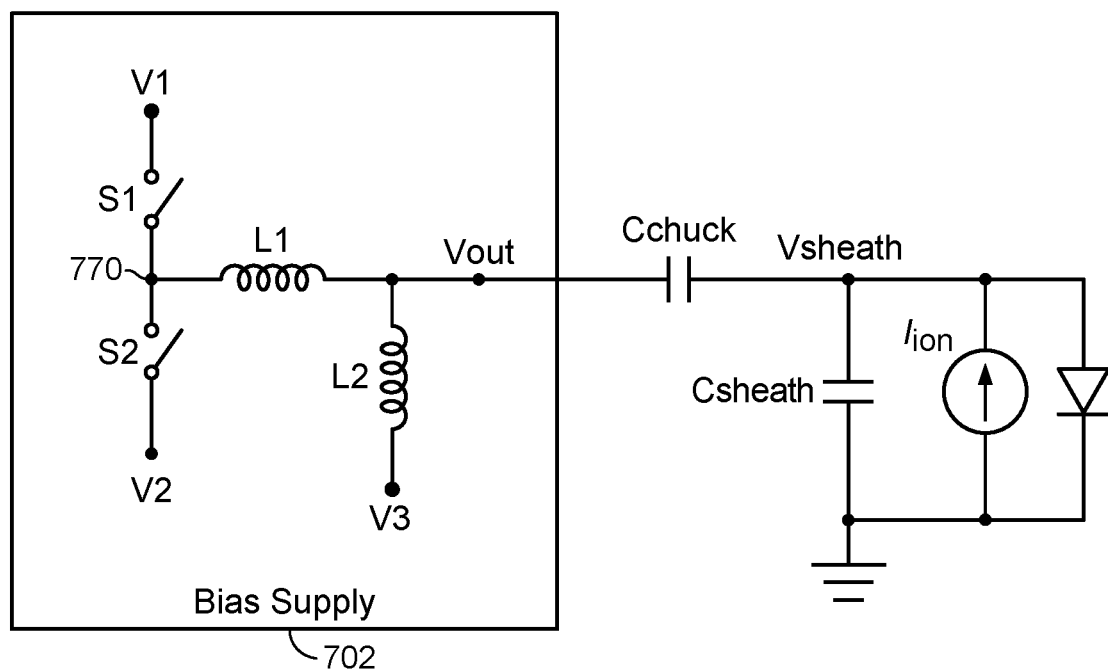
FIG. 7 is a diagram depicting aspects of an exemplary bias supply.

Referring next to FIG. 7, shown is a general representation of an exemplary bias supply 702 that may be used to realize the bias supplies 402, 602. As shown, the bias supply 702 utilizes three voltages V1, V2, and V3. Because the output, Vout, is capacitively coupled through Cchuck, it is generally not necessary to control the DC level of Vout and the three voltages can be reduced to two by choosing one of V1, V2 or V3 to be ground (0V). A separate chucking supply may be used so it is not necessary to control the DC level of Vout. If a separate chucking supply is not used, all three voltages can be controlled to control the DC level of Vout. Although not shown for clarity, the two switches S1, and S2 may be controlled by a switch controller via electrical or optical connection to enable the switch controller to open and close the switches, S1, S2, as disclosed below. The depicted switches S1, S2 may be realized by single pole, single throw switches, and as a non-limiting example, the switches S1, S2 may be realized by silicon carbide metal-oxide semiconductor field-effect transistors (SiC MOSFETs).

In this implementation, the voltages V1, V2, and V3 may be DC-sourced voltages. As shown, the first switch, S1, is disposed to switchably connect the first voltage, V1, to the output, Vout, through and inductive element and the second switch, S2, is disposed to switchably couple the second voltage, V2, to the output, Vout, through an inductive element. In this implementation the two switches connect to a common node, 670, and a common inductive element, L1, is disposed between the common node and an output node, Vout. Other arrangements of the inductive elements are possible. For example, there may be two separate inductive elements with one inductive element connecting S1 to Vout and another connecting S2 to Vout. In another example one inductive element may connect S1 to S2 and another inductive element may connect either S1 or S2 to Vout.

Figure 8:
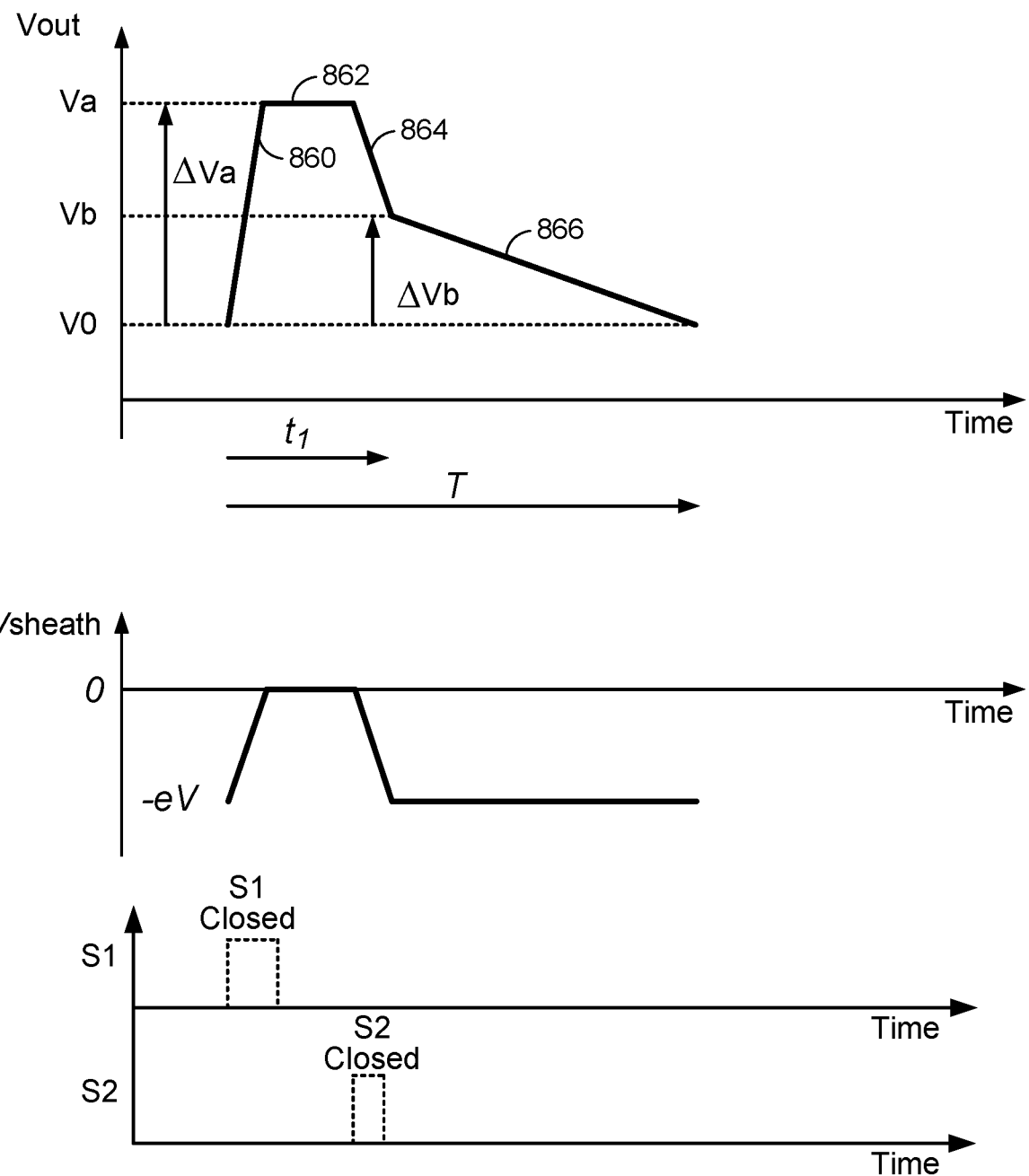
FIG. 8 includes a graph of a voltage waveform output from a bias supply; a graph of a corresponding sheath voltage; and a corresponding switch-timing diagram.

While referring to FIG. 7, simultaneous reference is made to FIG. 8, which depicts: 1) a cycle of the asymmetric periodic voltage waveform of the bias supply 702 that is output at Vout; 2) a corresponding sheath voltage; and 3) corresponding switch positions of switches S1 and S2. As shown, the periodic voltage waveform that is output by the bias supply 702 is asymmetric, so that a first half-cycle of the voltage waveform does not have a corresponding symmetrical component during a last half-cycle of the voltage waveform. In operation, the first switch, S1, is closed momentarily to increase, along a first portion 860 of the voltage waveform (between voltage V0 and Va) a level of the voltage at the output node, Vout, to a first voltage level, Va. The level Va is maintained along a second portion 862 of the waveform. The second switch, S2, is then closed momentarily to decrease, along a third portion 864 of the waveform, the level of the voltage waveform at the output node, Vout, to a second voltage level, Vb. Note that S1 and S2 are open except for short periods of time. As shown, the negative voltage swing along the third portion 864 affects the sheath voltage (Vsheath); thus, a magnitude of Va-Vb may be controlled to affect the sheath voltage.

In this embodiment, while the first and second switches S1, S2 are open, the third voltage, V3, is applied to the output node, Vout, through a second inductive element L2 to further decrease a level of the voltage at the output node along a fourth portion 866 of the voltage waveform. As shown in FIG. 8, the negative voltage ramp along the fourth portion 866 may be established to maintain the sheath voltage by compensating for ions that impact the substrate.

Thus, S1 momentarily connects and then disconnects the first voltage, V1, to the output, Vout, through the first inductive element L1, and after a period of time, S2 connects and then disconnects the second voltage (e.g., ground) to the output, Vout, through the first inductive element L1. The third voltage, V3, is coupled to the output, Vout, through a second inductive element L2. In this implementation, the first voltage, V1, may be higher than the third voltage V3, and the momentary connection and disconnection of the first voltage, V1, to the output Vout causes the voltage of the output, Vout, to increase along the first portion 860 of the voltage waveform to a first voltage level, Va, and the first voltage level, Va, is sustained along the second portion of the waveform 862. The first voltage level Va may be above the first voltage, V1, and the second voltage, V2, (e.g., ground) may be less than the first voltage level, Va. The momentary connecting and then disconnecting of the second voltage, V2, causes the voltage of the output to decrease at the third portion 864 to the second voltage level Vb that is below the second voltage, V2 (e.g., ground).

Figure 9:
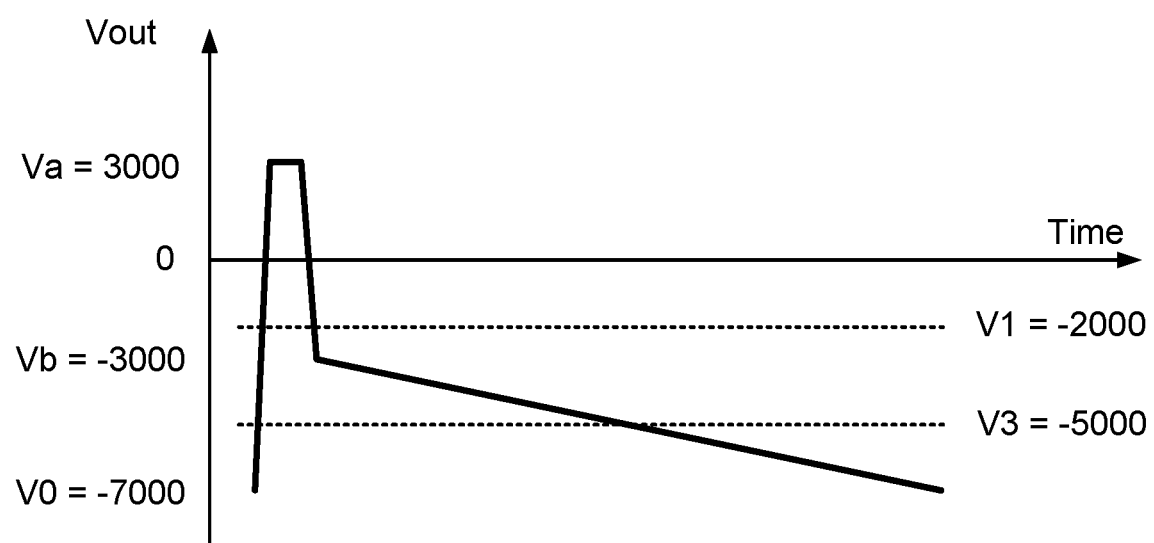
FIG. 9 is a graph depicting an exemplary bias supply waveform and exemplary voltage values.

As an example, as shown in FIG. 9, V1 may be −2000 VDC; V2 may be ground; V3 may be −5000 VDC; V0 may be −7000 VDC; Vb may be −3000 VDC; and Va may be 3000 VDC. But these voltages are merely exemplary to provide context to relative magnitude and polarities of the voltages described with reference to FIGS. 7 and 8.

Figure 10A:
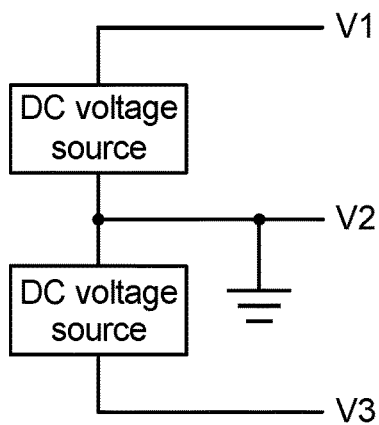
FIG. 10A depicts an implementation using two voltage sources to provide voltages to the bias supply depicted in FIG. 7.
Figure 10B:
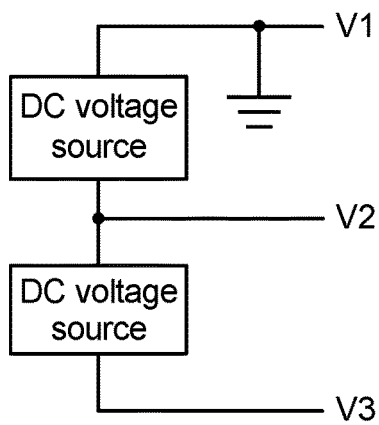
FIG. 10B depicts another implementation using two voltage sources to provide voltages to the bias supply depicted in FIG. 7.
Figure 10C:
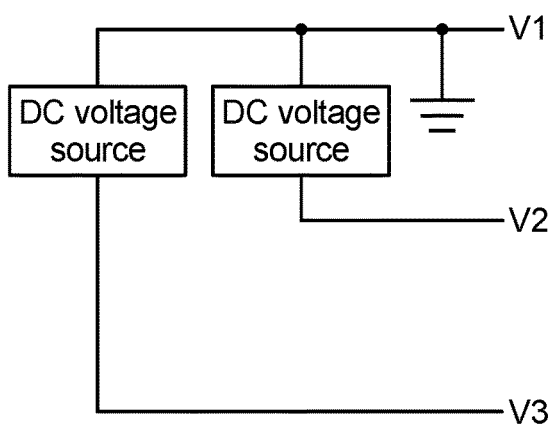
FIG. 10C depicts yet another implementation using two voltage sources to provide voltages to the bias supply depicted in FIG. 7.

Referring next to FIGS. 10A-10C shown are possible arrangements of two DC voltage sources to provide the voltages V1, V2, and V3 depicted in FIGS. 7 and 9. In FIG. 10A, V2 is grounded and forms a common node between the two DC voltage sources. In FIG. 10B, V1 is grounded and V2 forms a common node between the DC voltage sources. And in FIG. 10C, V1 is grounded and forms a common node between each of the two DC voltage sources.

Figure 11A:
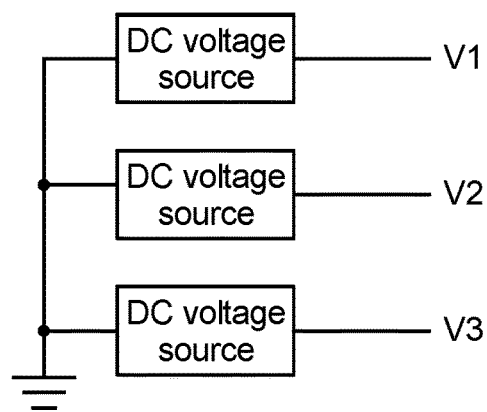
FIG. 11A depicts an implementation using three voltage sources to provide voltages to the bias supply depicted in FIG. 7.
Figure 11B:
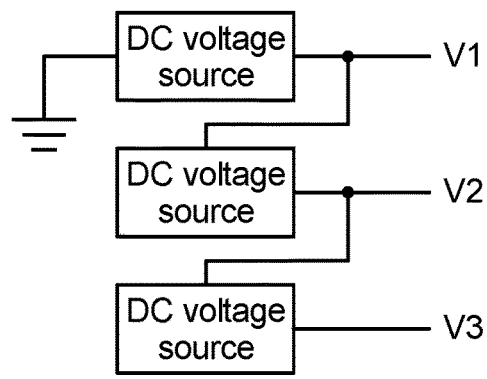
FIG. 11B depicts another implementation using three voltage sources to provide voltages to the bias supply depicted in FIG. 7.
Figure 11C:
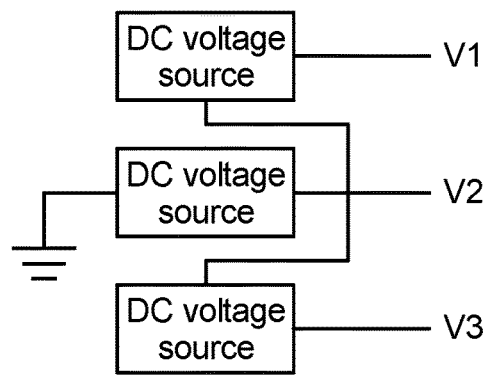
FIG. 11C depicts yet another implementation using three voltage sources to provide voltages to the bias supply depicted in FIG. 7.

In some embodiments, as shown in FIGS. 11A, 11B, and 11C, three DC voltage sources may be utilized to apply the three voltages V1, V2, and V3. As shown in FIG. 11A, each of the three DC voltage sources may be coupled to ground, and each of the three DC voltage sources provides a corresponding one of V1, V2, V3. In FIG. 11B one of the DC voltages sources is grounded and the three DC voltage sources are arranged in series. In FIG. 11C, one of DC voltages sources is disposed between ground and V2, and each of the DC voltage sources is coupled to V2.

Figure 12:
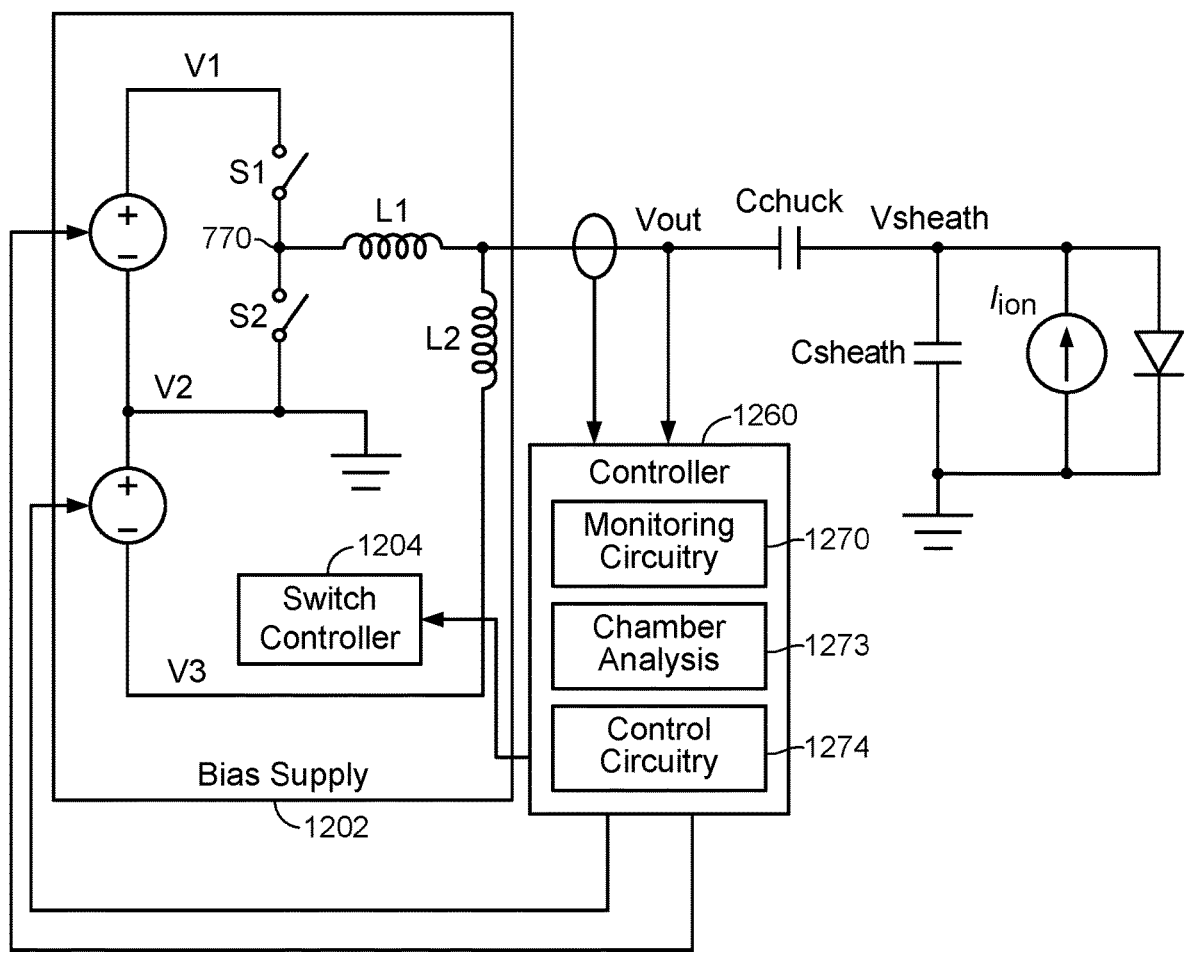
FIG. 12 is a diagram depicting aspects of an exemplary bias supply in connection with a control system.

Referring next to FIG. 12, shown is an exemplary bias supply 1202 that may be used to realize the bias supplies 402, 602. As shown, the bias supply 1202 includes a switch controller 1204 and two voltage sources to provide a first voltage V1, a second voltage V2, and a third voltage V3. Although not shown for clarity, the two switches S1, and S2 are coupled to the switch controller 1204 (e.g., via electrical or optical connection) to enable the switch controller 1204 to open and close the switches, S1, S2, as disclosed below. The depicted switches S1, S2 may be realized by single pole, single throw, normally open switches that are controllable by electrical or optical signal. As a non-limiting example, the switches S1, S2 the switches S1, S2 may be realized by silicon carbide metal-oxide semiconductor field-effect transistors (SiC MOSFETs).

Also shown is an exemplary controller 1260 that may be realized within a housing of each bias supply or may be realized as a part of a centralized tool controller. As shown, the controller 1260 is coupled to receive information (e.g., voltage and/or current information) indicative of the power applied by the bias supply 1202 at the output, Vout, of the bias supply. As shown, the controller 1260 is also coupled to the switch controller 1204 and the two DC voltage sources to enable the controller 1260 to control the bias supply 1202 (e.g., to control the plasma sheaths proximate to the bias electrodes).

In addition, the controller 1260 includes monitoring circuitry 1270 to measure at least one characteristic of the power that is applied by the bias supply 1202, and a chamber analysis component 1272 configured to calculate a characteristic of an environment within the plasma processing chamber 100 based upon the measured characteristic of the power obtained from the monitoring circuitry 1270. Also shown in the controller 1260 is control circuitry 1274 to adjust the power applied by the bias supply 1202 to control the plasma sheaths proximate to the bias electrodes. In FIG. 12, the controller 1260 and switch controller 1204 are depicted as separate constructs, but it should be recognized that the controller 1260 and switch controller 1204 may be integrated and/or share common underlying components. For example, the controller 1260 and switch controller 1204 may be collocated on the same printed circuit board. As another example, the controller 1260 and switch controller may be realized by a system that includes an architecture similar to, or the same as, the computing device depicted in FIG. 13.

The monitoring circuitry 1270 may include one or more sensors such as a directional coupler, V-I sensor, phase and gain sensor, voltage sensor, and a current sensor. As one of ordinary skill in the art will appreciate, the measured characteristic of power may include, voltage, current, phase, and power. In addition, the monitoring circuitry 1270 may include analog-to-digital conversion components to convert analog signals from the sensor(s) to digital representations of the measured characteristic of the power. In other implementations, the sensor(s) are separate from the controller 1260, and the monitoring circuitry 1270 includes analog-to-digital conversion components to convert analog signals from the sensor(s) to digital representations of the measured characteristic of the power. In yet other implementations, the sensor(s) include sensing elements and analog-to-digital conversion components, and the monitoring circuitry 1270 may receive the digital representation of the characteristic of the power. The monitoring of one or more characteristics of the environment of the plasma processing chamber may include measuring (with the monitoring circuitry 1270) at least one characteristic of the power that is applied by the at least one bias supply.

The chamber analysis component 1272 is generally configured to determine a characteristic of an environment within the plasma processing chamber based upon the the measured characteristic of the power obtained from the monitoring circuitry 1270. Although power may be measured (by the monitoring circuitry 1270) at a location that is exterior to the plasma processing chamber 100, the measured power characteristic may be used to calculate the characteristic of an environment within the plasma processing chamber 100. For example, using Equation 1, ion current in a region proximate to a bias zone may be calculated using measurements of voltage at Vout in connection with C1. As another example, using Equation 2, sheath capacitance in a region proximate to a bias zone may be calculated.

The control circuitry 1274 generally operates to adjust the power applied by the bias supply to adjust an aspect of the environment within the plasma processing chamber 100. For example, the plasma sheath proximate to a zone (established by the bias supply 1202) may be adjusted, and/or ion current may also be adjusted. As shown, the controller 1260 may be coupled to the DC voltage sources and the switch controller 1204; thus, with reference to FIG. 8, the controller 1260 may be used to adjust the voltage, Va, the voltage Vb, t1, T, and the slope of the fourth portion 866. As discussed with reference to FIG. 8, the voltage of the plasma sheath in proximity to a bias zone associated with the bias supply 1202 may be adjusted.

Referring again to FIG. 12, in this implementation (which incorporates the embodiment depicted in FIG. 10A), the second voltage, V2, is provided at a node that is coupled to two DC voltage sources and coupled to ground, but in other implementations (e.g., described above with reference to FIGS. 10B and 10C) the second voltage, V2, need not be ground. As shown, the first switch, S1, is disposed to switchably connect the first voltage, V1, to the common node 770 (that is common to S1 and S2), and the second switch, S2, is disposed to switchably couple the second voltage, V2, to the common node 770. In addition, the first inductive element, L1, is disposed between the common node and an output node, Vout.

In operation, the switch controller 1204 is configured close the first switch, S1, to increase, along a first portion 860 of the voltage waveform (between a voltage $V_0$, and Va) a level of the voltage at the output node, Vout, to a first voltage level, Va, that is maintained along the second portion 862 of the waveform, and then the first switch, S1, is opened. The switch controller 1204 then closes the second switch, S2, to decrease, along a third portion 864 of the waveform, the level of the voltage waveform at the output node, Vout, to a second voltage level, Vb, and then the switch controller 704 opens the second switch, S2, so that S1 and S2 are open. As shown, the negative voltage swing along the third portion 864 affects the sheath voltage (Vsheath); thus, a magnitude of Vb may be controlled to affect the sheath voltage in close proximity to the electrode plane coupled to Vout. Those of skill in the art will appreciate that Vb is controllable by controlling V1, but Vb is not equal to V1 by virtue of the effect of the inductor, L1, in this implementation.

In this embodiment, the second voltage source functions as an ion compensation component to apply, at least while the first and second switches S1, S2 are open, the third voltage, V3, to the output node, Vout, through a second inductive element L2 to further decrease a level of the voltage waveform at the output node along a fourth portion 866 of the periodic asymmetric voltage waveform. As shown in FIG. 8, the negative voltage ramp along the fourth portion 866 may be established to maintain the sheath voltage by compensating for ions that impact the substrate.

Thus, S1 momentarily connects and then disconnects the first voltage, V1, to the output, Vout, through the first inductive element L1, and after a period of time, S2 connects and then disconnects the second voltage (e.g., ground) to the output, Vout, through the first inductive element L1. The third voltage, V3, is coupled to the output, Vout, through a second inductive element L2. In this implementation, the first voltage, V1, may be higher than the third voltage V3, and the momentary connection and disconnection of the first voltage, V1, to the output Vout causes the voltage of the output, Vout, to increase along the first portion 860 of the voltage waveform to a first voltage level, Va, and the first voltage level, Va, is sustained along the second portion of the waveform 862. The first voltage level Va may be above the first voltage, V1, and the second voltage, V2, (e.g., ground) may be less than the first voltage level, Va. The momentary connecting and then disconnecting of the second voltage, V2, causes the voltage of the output to decrease at the third portion 864 to the second voltage level Vb that is below the second voltage, V2 (e.g., ground).

In an embodiment, one or more bias supplies may be used to measure ion density, sheath capacitance, or other chamber parameters with a reference substrate or no substrate in the chamber. One or more processing runs could be carried out, and then the measurements can be repeated. In this way, changes to the chamber can be monitored.

If a silicon top lid is used, then one or more bias supplies 402, 602, 702, 1202 can be used to monitor regional ion density and/or other chamber parameters. A silicon top lid (also referred to as a silicon vacuum seal) is typically consumable but may not be consumed in uniform manner. Using multiple bias supplies 402, 602, 702, 1202 to measure regional plasma characteristics may provide a means to infer non-uniform changes in the silicon vacuum seal. This feedback over time can be used to adjust RF source(s) 300 and/or bias supplies 402, 602, 702, 1202 to account for time varying non-uniformities in the silicon vacuum seal. Additionally, this feedback can be used to determine when the silicon vacuum seal may be due for replacement. In another embodiment, one or more bias supplies 402, 602, 702, 1202 can be coupled to an electrode adjacent to this silicon vacuum seal (e.g., at a top of the chamber). Since a bias supply 402, 702, 1202 can be used to modify or even eliminate the plasma sheath, this top-mounted bias supply 402, 602, 702, 1202 could be used to minimize or even eliminate a plasma sheath between the silicon vacuum seal and the plasma. In this way, erosion or consumption of the silicon vacuum seal can be reduced as compared to current processes.

Along these lines, each bias supply 402, 602, 702, 1202 and corresponding electrode could be arranged at various locations of the processing chamber in order to locally control plasma sheaths and thereby reduce or eliminate ion bombardment for certain regions or components of the chamber. Ion density and sheath capacitance, and local variations thereof, may be used to monitor chamber cleanliness. For instance, changes in local ion density over time may indicate that a local chamber surface has accumulated one or more films. In another embodiment, multiple electrostatic chuck voltages distributed in space could be used to influence regional ion density.

Figure 13:
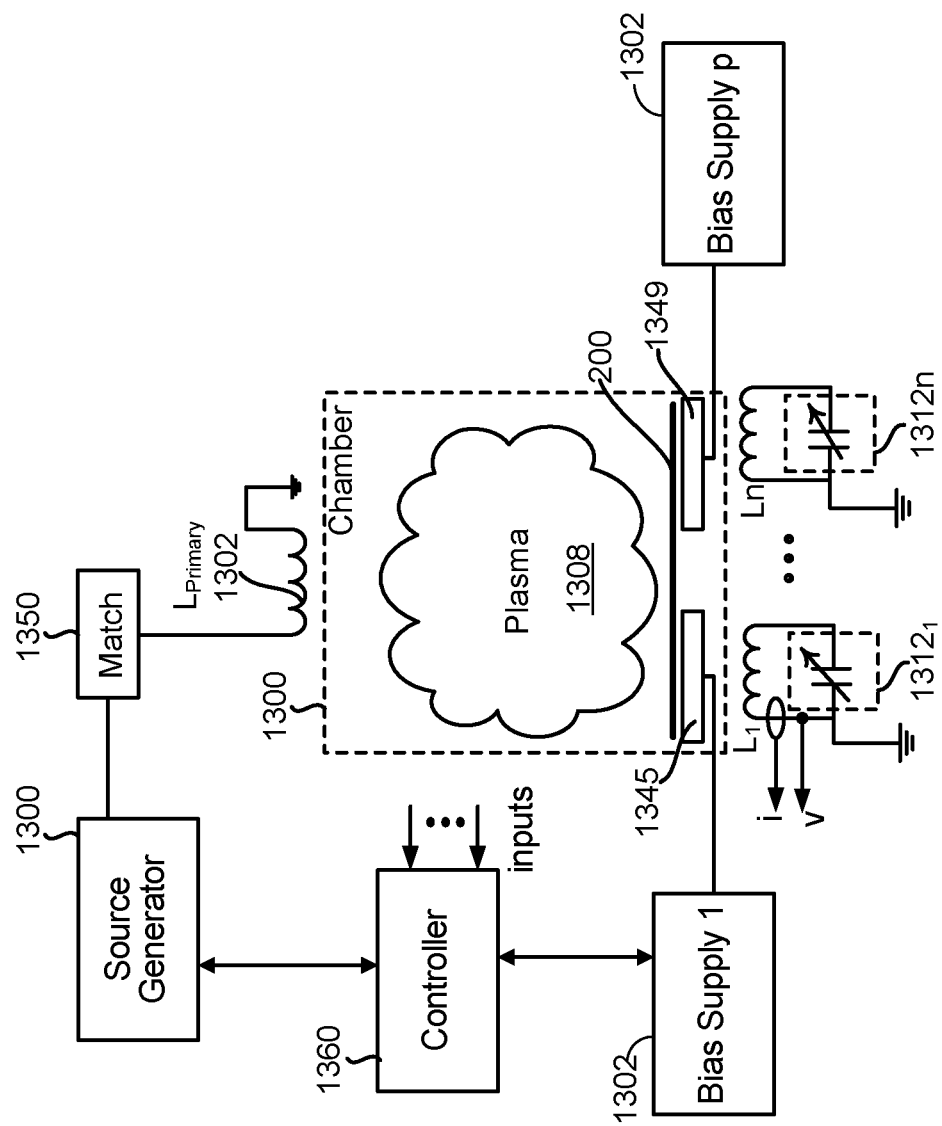
FIG. 13 is a diagram depicting an inductively-coupled plasma processing system with a plurality of bias zones.

Referring next to FIG. 13, shown is an inductively-coupled plasma processing system comprising a primary coil 1302 that is actively driven by a source generator 1300 (via a match 1350) to ignite and sustain a plasma 1308 in a plasma processing chamber 1300. As depicted, the exemplary system comprises n secondary coils $L_{1-n}$ (where n is equal to or greater than one) that are inductively coupled to the plasma 1308, and the plasma 1308 is inductively coupled to the primary coil 1302. As a consequence, the secondary coils $L_{1-n}$ are inductively coupled to the primary coil 1302 via the plasma 1308 so that power is applied to the secondary coils $L_{1-n}$ by the plasma 1308.

As depicted, coupled to each of the n secondary coils $L_{1-n}$ are a corresponding one of n terminating elements $1312_{1-n}$, which passively terminate each of the n secondary coils $L_{1-n}$. This architecture is very different from known techniques (such as described above) that rely on actively driving each coil $L_{1-n}$. Beneficially, because the secondary inductors are not actively driven, the secondary coils may be placed about the chamber 1300 with added ease and spatial plasma control is more conveniently achieved because the secondary inductors $L_{1-n}$ are driven by mutual coupling, via the plasma 1308, to the primary coil 1302. As a consequence, there is no need for a direct power feed to the secondary inductors $L_{1-n}$. Multiple secondary coils can be added in this manner beyond what is practical for adding multiple directly-powered secondary coils due to the inherent complexity and cost of additional powered feeds. Thus, plasma density may be manipulated in a more cost-effective manner.

In operation, power is applied through the match 1350 to the primary coil 1302, which effectively applies power to the chamber 1300, and once ignited, the plasma 1308 effectively operates as a secondary of a transformer, and the current that is induced in the plasma 1308 induces current in the secondary coils $L_{1-n}$. In turn, the current that is induced in the secondary coils $L_{1-n}$ induces current in the plasma 1308 and affects the density of the plasma 1308 in the regions proximate to each of the secondary coils $L_{1-n}$.

The n terminating elements 1312₁, may be passive and fixed impedance elements or may be passive impedance-adjustable terminating elements, and it is contemplated that some of then terminating elements may be adjustable and some of the terminating elements may be fixed. The impedance-adjustable terminating elements 1312 may be variable reactance elements, which may be realized as variable capacitor (as depicted in FIG. 13) or may be realized as a variable inductor in series with a capacitor. In general, the terminating elements enable the current through each of the n secondary coils $L_{1-N}$ to be regulated; thus, enabling the ratio of current between the primary 1302 and the n secondary coils $L_{1-n}$ to be regulated. As a consequence, the plasma densities in regions proximate to each of the primary 1302 and secondary coils $L_{1-n}$ may be regulated.

The source generator 1300 may be a 13.56 MHz generator, but this is certainly not required and other frequencies are certainly contemplated. And the match 1350 may be realized by a variety of match network architectures. As one of ordinary skill in the art will appreciate, the match 1350 is used to match the load of the plasma 1308 to the source generator 1300. By correct design of the matching network 1350 (either internal to a housing of the source generator 1300 or external as shown in FIG. 13), it is possible to transform the impedance of the load to a value close to the desired load impedance of the source generator 1300.

Also shown in FIG. 13 are one or more bias supplies 1302, which may be realized by, and operate the same way, as the bias supplies 402, 602, 702, 1202 described previously herein. As shown, each bias supply 1302 is coupled to a corresponding electrical plane 1345, 1349 to form multiple bias zones within the plasma processing chamber 1300. Although FIG. 13 depicts two bias zones, it should be recognized that embodiments may include a single bias zone or more than two bias zones. In some implementations, the number of bias zones is equal to the number of passive terminating elements 1312, and in other implementations, there may be more bias zones than passive terminating elements 1312 or less bias zones than passive terminating elements 1312.

Each of the bias supplies 1302 may be controlled independently of the other bias supply. Using electrical planes 1345, 1349 and corresponding bias supplies 1302 allows non-uniform biasing across the substrate 200. For instance, a higher bias may be applied to electrical plane 1345 than electrical plane 1349, or vice versa. Alternatively, different pulsing regimes can be applied to each electrical plane 1345, 1349. While non-uniform biasing can be applied, the result may be a uniform surface potential on the substrate 200. In other words, implementations with multiple buried electrical planes can be used to mitigate non-uniformities in the plasma, substrate, etc., and thereby achieve a uniform plasma sheath above the substrate.

As discussed above, multiple bias supplies 1302 and their corresponding ability to measure ion current, and hence, ion density at different locations within the chamber can be utilized as feedback for the bias supplies 1302 and/or the source generator 1300. And sheath capacitance may be calculated and utilized as a parameter value to control sheath capacitance and affect the plasma sheath. where complex, region-specific, control of plasma density (e.g., to achieve plasma density uniformity) is desired.

The feedback from one or more bias supplies 1302 may be used to control one or more of the passive terminating elements $1312_{1-n}$, in order to control the current through one or more corresponding secondary coils $L_{1-n}$. For example, the bias supply 1302 applying a voltage waveform (e.g., the periodic voltage waveforms described with reference to FIGS. 8 and 9) to the electric plane 1345 may be used to obtain feedback about ion current, ion density, and plasma density, which may be used to control an impedance of the terminating element 1312₁, and hence, control current though $L_1$ which affects the plasma density proximate to the electrical plane 1345.

As shown, a controller 1360 may be coupled to the source generator 1300 and the bias supplies 1302, and the controller 1360 may receive multiple inputs. For example, the inputs may include, without limitation, one or more digital and/or analog inputs from current sensors, voltage sensors, optical sensors, another controller, and/or man-machine interfaces. As one example, one or more current and/or voltage sensors may be coupled to the secondary inductors $L_{1-n}$ to sense current through the secondary inductor(s) $L_{1-n}$ and/or voltage(s) at the secondary inductor(s) $L_{1-n}$ and the outputs of these sensors may be coupled to the controller 1360.

It is noted that the controller 1360 may be realized by distributed control components or the controller may be collocated in a single housing. The depiction of the controller 1360 as a unitary block is a functional depiction for ease of depiction. As an additional example, control logic for the system depicted in FIG. 13 may be distributed among the bias supply 1302 (or bias supplies 1302 if there are more than one), the source generator 1300, the match 1350, and/or a separate controller 1360.

Figure 14:
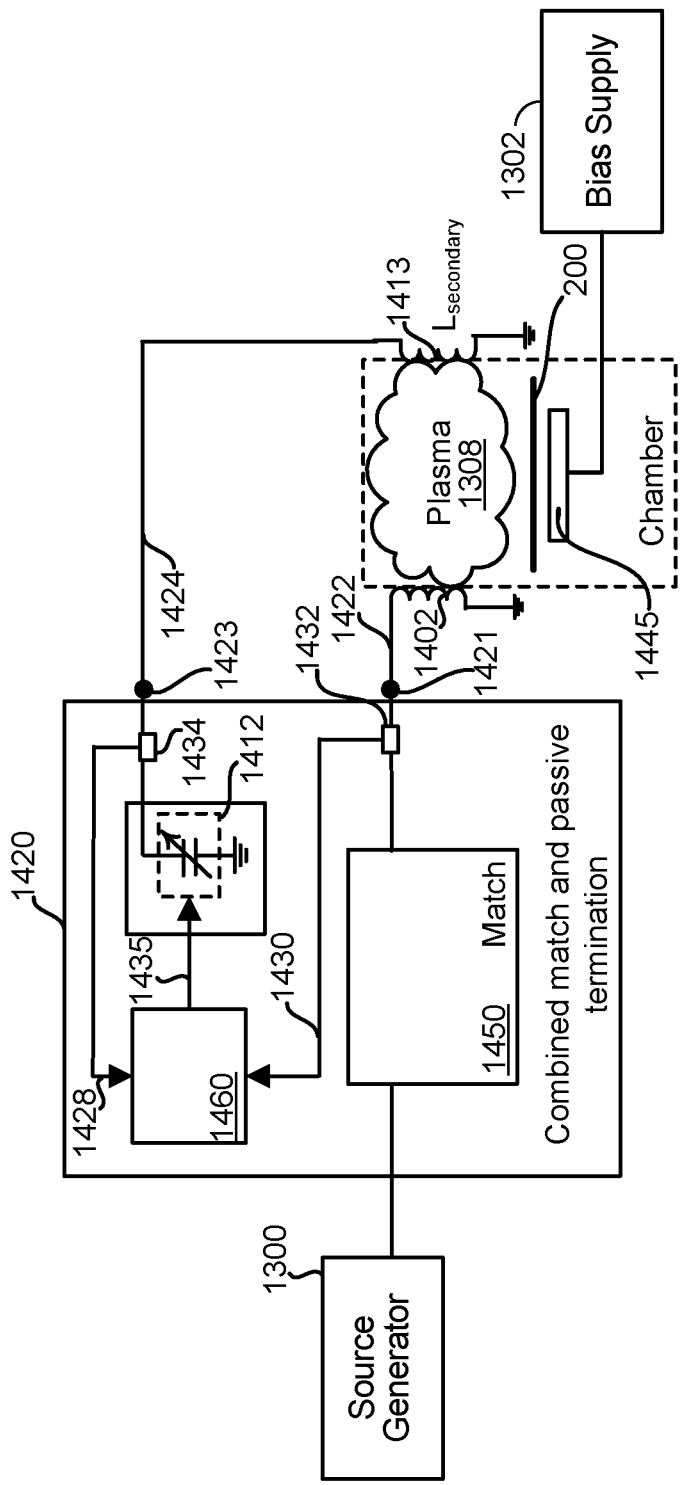
FIG. 14 is a diagram depicting another inductively-coupled plasma processing system with a bias zone.

Referring next to FIG. 14, shown is an exemplary embodiment in which a terminating element (e.g., variable capacitor) and a match network 1450 are both positioned within the same housing 1420. As shown, at or near the housing 1420 is a primary terminal 1421 that is coupled to a first output conductor 1422 that couples the source generator 1300 (through the match 1406 and primary terminal 1421) to a primary coil 1402. And a secondary terminal 1423, positioned at or near the housing 1420, is coupled to a second output conductor 1424 that couples a terminating element 1412 and secondary terminal 1423 to a secondary coil 1413. In addition, a control portion 1460 (also referred to herein as a controller 1460) is disposed to receive input signals 1428, 1430 indicative of current levels (which are indicative of the density of the plasma 1308 in the regions proximate to the coils 1402, 1413) in the first 1422 and second 1424 output conductors from first 1432 and second 1434 sensors (e.g., current transducers), respectively. And the control portion 1460 is also arranged to control a value (e.g., capacitance) of the passive terminating element 1412 (e.g., variable capacitor).

In variations of the embodiment depicted in FIG. 14, instead of current sensors 1432, 1434 (or in addition to current sensors 1432, 1434) other sensing components (either within or outside of the housing 1420) may be used to provide an indication of the plasma density in close proximity to the coils 1413. For example, optical sensors may be used to sense plasma properties (e.g., plasma density). It is also contemplated that the bias supply 1302 may provide an indication of plasma density to the controller 1460 by providing information about its output voltage and/or an indication of ion current in the plasma 1308 to the controller 1460. In turn, the controller 1460 may control the terminating element(s) 1413 based upon information received from the bias supply 1302. Although not shown, the control portion 1460 may include a man-machine interface (e.g., display and input controls) to enable a user to receive feedback and facilitate control of the plasma 1308.

It should be recognized that the depicted components in FIG. 14 is logical and not intended to be a hardware diagram. For example, the control portion 1460 and the sensors 1432, 1434 may each be realized by distributed components, and may be implemented by hardware, firmware, software or a combination thereof. In many variations of the embodiment depicted in FIG. 14, the sensed current levels are converted to a digital representation, and the controller 1460 uses the digital representation of the current signals 1428, 1430 to generate a control signal 1435 to drive the terminating element 1412. In addition, the match 1450 may be controlled by the control portion 1460 or may be separately controlled.

It should also be recognized that, for simplicity, only one secondary coil 1413 and one passive terminating element 1412 are depicted, but it is certainly contemplated that two or more secondary coils 1413 may be implemented in connection with two or more passive terminating elements 1412 (e.g., two or more passive termination elements housed with the match).

As shown, the bias supply 1302 is coupled to an electrical plane 1445 to form a bias zone in close proximity to the substrate 200. A single bias supply 1302 and electrical plane 1445 are shown as an example, but in many implementations multiple bias supplies 1302 and electrical planes are utilized to form multiple bias zones in the configuration depicted in FIG. 14. Although not required, the bias supply 1302 and/or source generator 1300 may be communicatively coupled to the controller 1460 to enable the controller 1460 to receive operating information from the source generator 1300 and/or the bias supply 1302. The controller 1460 may operate in the same way as the controller 1360 to spatially control plasma density by adjusting the terminating element 1412 and/or adjusting the bias supply 1302.

In operation, the source generator 1300 applies power, through the match 1450, to the primary coil 1402 and the current in the primary coil 1402 (which is sensed by the first sensor 1432) induces current in the plasma 1308, which in turn, induces current in the secondary coil 1413. And the current flowing through the secondary coil 1413, and hence the second output conductor 1424 and secondary terminal 1423, is sensed by the second sensor 1434. As discussed with reference to FIG. 13, unlike prior art implementations, the power that is applied by the secondary coil 1413 to the plasma 1308 is derived from current flowing through the primary coil 1402. More particularly, the secondary coil 1412 obtains power from the primary coil 1402 through the plasma 1308.

The control portion 1460, sensors 1432, 1434, terminating element(s) 1412 and (in some implementations, the bias supply 1302) collectively form a control system to control aspects of the plasma (e.g., the spatial distribution of the plasma). The control portion 1460 in this embodiment is configured, responsive to the relative current levels in the primary 1402 and secondary 1413 coils, to alter the value (e.g., the capacitance) of the passive terminating element 1412 (e.g., variable capacitor) so that the ratio of current between the primary 1402 and secondary 1413 coils is at a value that corresponds to a desired plasma density profile within the chamber 1410.

Figure 15:
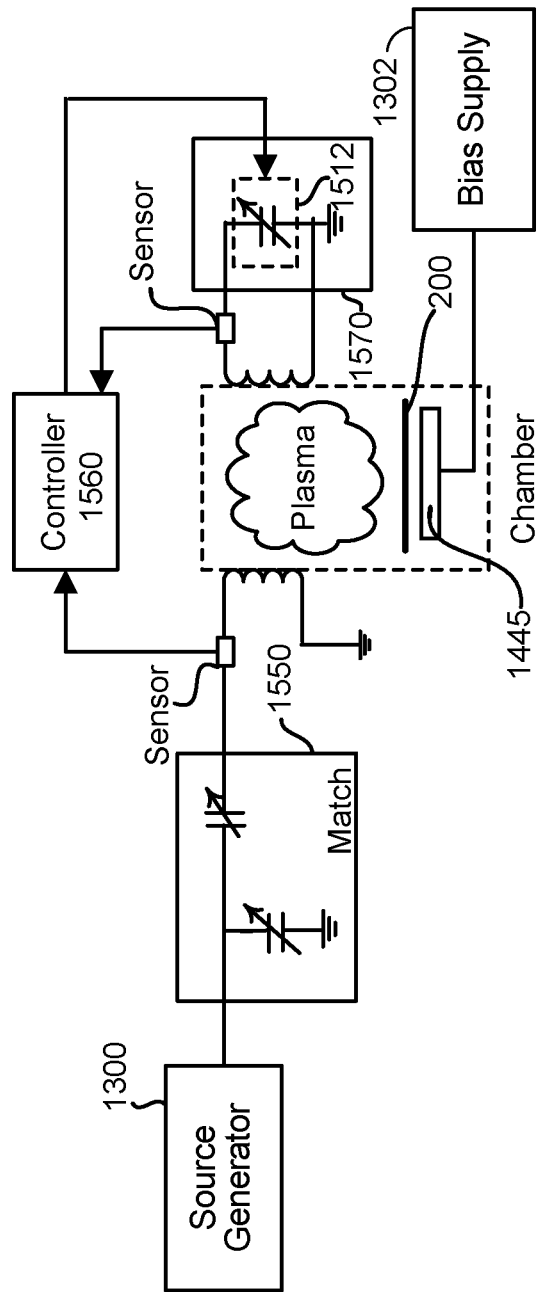
FIG. 15 is a diagram depicting yet another inductively-coupled plasma processing system with a bias zone.

Referring next to FIG. 15, shown is another embodiment in which a passive terminating element 1512 is implemented in a separate housing 1570 (separate from a match 1350 and controller 1560) in close proximity with a chamber. The components in the present embodiment operate in a substantially similar manner as the components depicted in FIG. 14, but the passive element 1512 may be implemented as a separate appliance or may be integrated with the chamber 1510.

Figure 16:
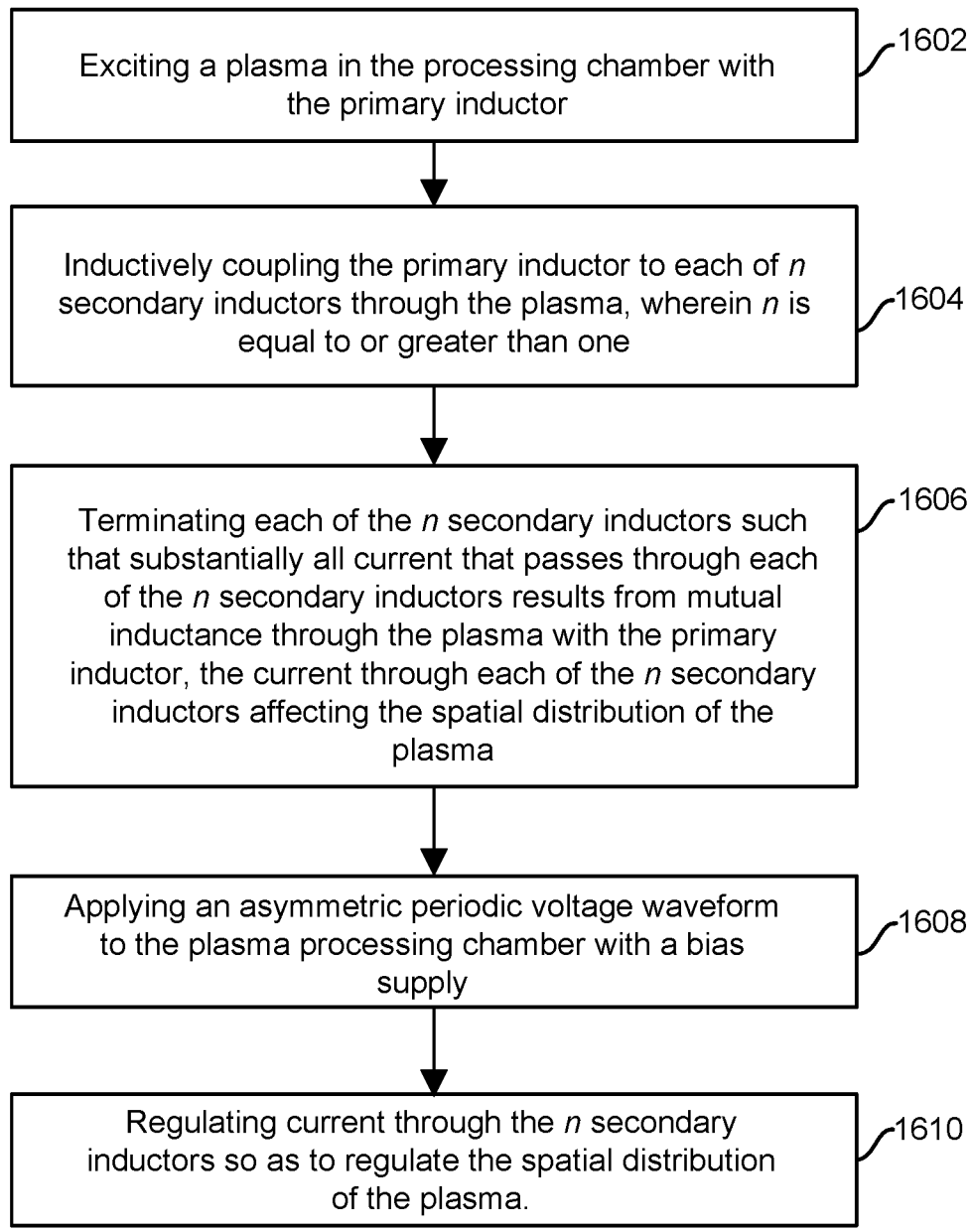
FIG. 16 is a flowchart depicting a method that may be traversed in connection with embodiments disclosed herein.

Referring next to FIG. 16, it is a flowchart depicting steps that may be traversed in connection with the embodiments disclosed herein for controlling the spatial distribution of plasma in a processing chamber. As depicted, when power is applied (e.g., directly applied by source generator 300, 1300 via match) to a primary inductor (e.g., the primary coil 1302, 1402), a plasma in the chamber is excited and sustained (Block 1602). In addition, the primary inductor is inductively coupled to each of n (where n is equal to or greater than one) secondary conductors (e.g., secondary coils $L_{1-n}$) through the plasma (Block 1604), and each of the n secondary inductors is terminated such that current (e.g., substantially all current) that passes through each of the n secondary inductors results from mutual inductance through the plasma with the primary inductor (Block 1606). In addition, an asymmetric periodic voltage waveform is applied to the plasma processing chamber with a bias supply (e.g., bias supply 402, 602, 702, 1202, 1302)(Block 1608). As previously discussed, the current through each of the n secondary inductors affects the spatial distribution of the plasma. Although not required, in some variations, the current through the n secondary inductors is regulated so as to regulate the spatial distribution of the plasma (Block 1610).

Figure 17:
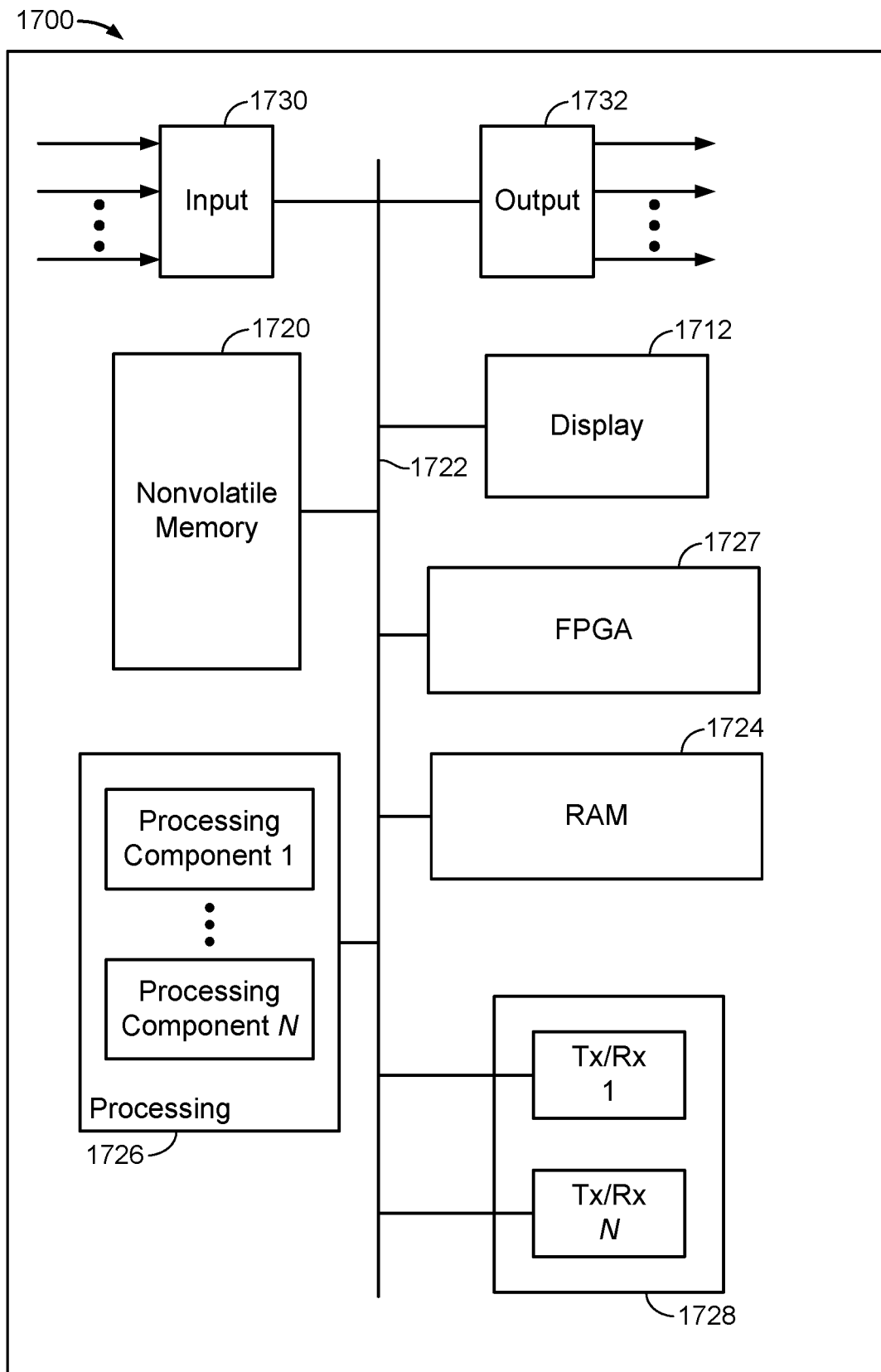
FIG. 17 is a block diagram depicting an exemplary computing device.

The methods described in connection with the embodiments disclosed herein may be embodied directly in hardware, in processor-executable code encoded in a non-transitory tangible processor readable storage medium, or in a combination of the two. Referring to FIG. 17 for example, shown is a block diagram depicting physical components that may be utilized to realize control aspects of the source generators 300, 1300; the bias supplies 402, 602, 702, 1202, 1302; and the terminating elements 1312, 1412, 1512 according to an exemplary embodiment. As shown, in this embodiment a display portion 1712 and nonvolatile memory 1720 are coupled to a bus 1722 that is also coupled to random access memory ("RAM") 1724, a processing portion (which includes N processing components) 1726, a field programmable gate array (FPGA) 1727, and a transceiver component 1728 that includes N transceivers. Although the components depicted in FIG. 17 represent physical components, FIG. 17 is not intended to be a detailed hardware diagram; thus, many of the components depicted in FIG. 17 may be realized by common constructs or distributed among additional physical components. Moreover, it is contemplated that other existing and yet-to-be developed physical components and architectures may be utilized to implement the functional components described with reference to FIG. 17.

This display portion 1712 generally operates to provide a user interface for a user, and in several implementations, the display is realized by a touchscreen display. In general, the nonvolatile memory 1720 is non-transitory memory that functions to store (e.g., persistently store) data and processor-executable code (comprising executable code that is associated with effectuating the methods described herein). In some embodiments for example, the nonvolatile memory 1720 includes bootloader code, operating system code, file system code, and non-transitory processor-executable code to facilitate the execution of a method of biasing different localized regions of the substrate or plasma processing chamber as described with reference to relative to FIGS. 1-16. One or more of the monitoring circuitry 1270, chamber analysis component 1272, control circuitry 1272, and controllers 660, 1360, 1460, 1560 may be realized, at least in part, by the non-transitory processor-executable code.

In many implementations, the nonvolatile memory 1720 is realized by flash memory (e.g., NAND or ONENAND memory), but it is contemplated that other memory types may be utilized as well. Although it may be possible to execute the code from the nonvolatile memory 1720, the executable code in the nonvolatile memory is typically loaded into RAM 1724 and executed by one or more of the N processing components in the processing portion 1726.

The N processing components in connection with RAM 1724 generally operate to execute the instructions stored in nonvolatile memory 1720 to enable execution of the algorithms and functions disclosed herein. It should be recognized that several algorithms are disclosed herein, but some of these algorithms are not represented in flowcharts. Processor-executable code to effectuate methods of biasing different localized regions of the substrate or chamber as shown in and described relative to FIGS. 1-16 may be persistently stored in nonvolatile memory 1720 and executed by the N processing components in connection with RAM 1724. As one of ordinarily skill in the art will appreciate, the processing portion 1726 may include a video processor, digital signal processor (DSP), micro-controller, graphics processing unit (GPU), or other hardware processing components or combinations of hardware and software processing components (e.g., an FPGA or an FPGA comprising digital logic processing portions).

In addition, or in the alternative, non-transitory FPGA-configuration-instructions may be persistently stored in nonvolatile memory 1720 and accessed (e.g., during boot up) to configure a field programmable gate array (FPGA) to implement the algorithms disclosed herein and to effectuate one or more of the functions of the controller 1260, 1360, 1460, 1560 or other aspects of the source generators 300, 1300 and bias supplies. 402, 602, 702, 1202, 1302.

The input component 1730 may operate to receive signals (e.g., current, voltage, and phase information and/or a synchronization signal between bias supplies and the source generator) that are indicative of one or more aspects of an environment within the plasma processing chamber 100, 1300 and/or synchronized control between a source generator 300 and the bias supplies 402, 602, 702, 1202, 1302. The signals received at the input component may include, for example, the synchronization signals, current and/or voltage signals from sensors coupled to the terminating elements 1312, 1412, 1512, power control signals to the various generators and power supply units, or control signals from a user interface. The output component generally operates to provide one or more analog or digital signals to effectuate an operational aspect of controlling the bias supplies (e.g., localized biasing of the substrate and/or other components within the plasma processing chamber 100, 1300) and/or terminating elements 1312, 1412, 1512 as disclosed herein and/or signal(s) to effect synchronization between the source generators 300, 1300 and the bias supplies 402, 602, 702, 1202, 1302. For example, the output portion 1732 may provide a synchronization signal between the bias supplies 402, 602, 702, 1202, 1302 the source generators 300, 1300. The output portion 1732 may also send control signals to the terminating elements 1312, 1412, 1512.

The depicted transceiver component 1728 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

As will be appreciated by one skilled in the art, aspects of the present disclosure may be embodied as a system, method or computer program product. Accordingly, aspects of the present disclosure may take the form of an entirely hardware embodiment, an entirely software embodiment (comprising firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

As used herein, the recitation of "at least one of A, B or C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A method for plasma processing, the method comprising:
   sustaining a plasma in a plasma processing chamber by inductively coupling a primary inductor to n secondary inductors so current that passes through each of the n secondary inductors results from mutual inductance through the plasma with the primary inductor;

applying an asymmetric periodic voltage waveform to each of a plurality of zones in the plasma processing chamber with a plurality of corresponding bias supplies;

adjusting at least one of current though one or more of the n secondary inductors or one or more characteristics of the asymmetric periodic voltage waveforms to alter a spatial distribution of the plasma.

2. The method of claim 1, comprising:
monitoring at least one characteristic of the power that is applied by each of the corresponding bias supplies, and wherein the adjusting is based upon the monitoring.

3. A method for plasma processing, the method comprising:
sustaining a plasma in a plasma processing chamber by inductively coupling a primary inductor to n secondary inductors so current that passes through each of the n secondary inductors results from mutual inductance through the plasma with the primary inductor;
applying an asymmetric periodic voltage waveform to the plasma processing chamber with a bias supply;
adjusting at least one of current though one or more of the n secondary inductors or one or more characteristics of the asymmetric periodic voltage waveforms to alter a spatial distribution of the plasma; and
calculating ion current in a zone of the plasma processing chamber based upon at least one characteristic of the power that is applied by the bias supply;
wherein the adjusting is based upon the calculated ion current in the zone.

4. The method of claim 3, comprising:
applying an asymmetric periodic voltage waveform to each of a plurality of zones in the plasma processing chamber with a corresponding bias supply; and
calculating ion current in each of the plurality of zones in the plasma processing chamber based upon at least one characteristic of the power that is applied by each of the plurality of bias supplies.

5. The method of claim 4, wherein the adjusting comprises adjusting density of the plasma proximate to each of the plurality of zones by adjusting current though one or more of the n secondary inductors based upon at least one characteristic of the power that is applied by each of the plurality of bias supplies.

6. The method of claim 4, wherein the adjusting comprises adjusting density of the plasma proximate to each of the plurality of zones by adjusting one or more characteristics of the asymmetric periodic voltage waveforms.

7. A non-transitory computer-readable medium comprising instructions stored thereon, for at least one of execution by a processor or for configuring a field programmable gate array, to perform plasma processing, the instructions comprising instructions to:
maintain a plasma in a plasma processing chamber by controlling current in n secondary inductors, wherein n is greater than or equal to one and the current in the n secondary inductors results from mutual inductance through the plasma with a primary inductor;
apply an asymmetric periodic voltage waveform to the plasma processing chamber with a bias supply;
monitor at least one characteristic of the power that is applied by the bias supply; and
adjust, based upon the monitoring, at least one of:
current though one or more of the n secondary inductors or one or more characteristics of the asymmetric periodic voltage waveform to alter a spatial distribution of the plasma.

8. The non-transitory computer-readable medium of claim 7, comprising instructions to:
calculate ion current in a zone of the plasma processing chamber based upon at least one characteristic of the power that is applied by the bias supply; and
wherein the instructions to adjust include instructions to adjust based upon the calculated ion current in the zone.

9. The non-transitory computer-readable medium of claim 7, comprising instructions to:
apply an asymmetric periodic voltage waveform to each of a plurality of zones in the plasma processing chamber with a corresponding bias supply; and
calculate ion current in each of the plurality of zones in the plasma processing chamber based upon at least one characteristic of the power that is applied by each of the plurality of bias supplies.

10. The non-transitory computer-readable medium of claim 9, wherein the instructions to adjust comprise instructions to adjust a density of the plasma proximate to each of the plurality of zones by adjusting current though one or more of the n secondary inductors based upon the calculated ion current in one or more of the plurality of zones.

11. The non-transitory computer-readable medium of claim 9, wherein the instructions to adjust comprise instructions to adjust a density of the plasma proximate to each of the plurality of zones by adjusting one or more characteristics of the asymmetric periodic voltage waveforms based upon the calculated ion current in one or more of the plurality of zones.

12. A system for controlling a plasma in a processing chamber, the system comprising:
a source generator;
a primary inductor coupled to the source generator to excite the plasma when power is actively applied by the source generator to the primary inductor;
n secondary inductors positioned relative to the primary inductor so that current that passes through the n secondary inductors results from mutual inductance through the plasma with the primary inductor, wherein n is greater than or equal to one;
a terminating element coupled to each of the n secondary inductors to form n terminating elements, the terminating element affecting the current through a corresponding secondary inductor to affect the spatial distribution of the plasma;
at least one electrical plane arranged within the plasma processing chamber to control a plasma sheath proximate to the at least one electrical plane;
at least one bias supply coupled to the at least one electrical plane; and
at least one controller coupled to the at least one bias supply to apply an asymmetric periodic voltage waveform to the at least one electrical plane to control the plasma sheath proximate to the electrical plane,
wherein the terminating element is an impedance-adjustable terminating element to enable current through the at least one secondary inductor to be controlled by the at least one controller based upon an indication of a level of ion current in the plasma proximate to the at least one electrical plane.

13. The system of claim 12 wherein the indication of the level of ion current is obtained from at least one characteristic of power that is applied by the at least one bias supply to the at least one electrical plane.

14. The system of claim 12, comprising at least one sensor coupled to at least one of the n terminating elements, wherein the controller is adapted to regulate the current through the at least one of the n terminating elements responsive to a signal from the at least one sensor to regulate the plasma density.

15. The system of claim 14, wherein the at least one sensor includes a current sensor and wherein the impedance-adjustable terminating elements include a variable capacitor.

* * * * *